(12) United States Patent
Hattori et al.

(10) Patent No.: US 6,901,548 B2
(45) Date of Patent: May 31, 2005

(54) CODING APPARATUS, CODING METHOD AND RECORDING MEDIUM HAVING CODED PROGRAM RECORDED THEREIN, AND DECODING APPARATUS, DECODING METHOD AND RECORDING MEDIUM HAVING DECODED PROGRAM RECORDED THEREIN

(75) Inventors: Masayuki Hattori, Kanagawa (JP); Jun Murayama, Tokyo (JP); Toshiyuki Miyauchi, Tokyo (JP); Kouhei Yamamoto, Tokyo (JP); Takashi Yokokawa, Tokyo (JP)

(73) Assignee: Sony Corporation, Tokyo (JP)

( * ) Notice: Subject to any disclaimer, the term of this patent is extended or adjusted under 35 U.S.C. 154(b) by 963 days.

(21) Appl. No.: 09/821,008

(22) Filed: Mar. 29, 2001

(65) Prior Publication Data

US 2001/0047502 A1 Nov. 29, 2001

(30) Foreign Application Priority Data

Mar. 30, 2000 (JP) ........................................ 2000-097945

(51) Int. Cl.$^7$ ............................................. H03M 13/00
(52) U.S. Cl. ........................................ 714/755; 714/777
(58) Field of Search ................................ 714/752, 786, 714/701, 755, 777; 370/342

(56) References Cited

U.S. PATENT DOCUMENTS

| | | | | |
|---|---|---|---|---|
| 4,882,733 A | * | 11/1989 | Tanner ........................ | 714/752 |
| 5,781,542 A | * | 7/1998 | Tanaka et al. ............... | 370/342 |
| 5,844,922 A | * | 12/1998 | Wolf et al. .................. | 714/786 |
| 6,351,832 B1 | * | 2/2002 | Wei ............................. | 714/701 |
| 6,473,878 B1 | * | 10/2002 | Wei ............................. | 714/755 |

FOREIGN PATENT DOCUMENTS

| | | |
|---|---|---|
| EP | 1 075 088 | 2/2001 |
| EP | 1 137 191 | 9/2001 |

OTHER PUBLICATIONS

Divsalar D et al: "Serial Concatenated Trellis Coded Modulation With Rate–1 Inner Code" GLOBECOM'00. 2000 IEEE Global Telecommunications Conference. San Francisco, CA, Nov. 27–Dec.1, 2000, IEEE Global Telecommunications Conference, New York, NY : IEEE, US, vol. vol. 2 of 4, Nov. 27, 2000, pp. 777–782, XP001017192 ISBN: 0–7803–6452–X.

Peleg M et al: "On interleaved, differentially encoded convolutional codes" IEEE Transactions on Information Theory, IEEE Inc. New York, US, vol. 45, No. 7, Nov. 1999, pp. 2572–2582, XP002185118 ISSN: 0018–9448.

(Continued)

*Primary Examiner*—David Ton
(74) *Attorney, Agent, or Firm*—Frommer Lawrence & Haug LLP; William S. Frommer

(57) ABSTRACT

To carry out error correction coding and decoding according to a serially concatenated coded modulation system with a small circuit scale and high performance. A coding apparatus 1 is designed so that an interleaver 20 interleaves order of bits so that all weights are coded by a convolutional coder 30 with respect to data comprising a series of 3 bits supplied from a convolutional coder 10; the convolutional coder 30 makes as small as possible the total value of the hamming distance of input bit between passes to be the minimum Euclidean distance with respect to data of 3 bits supplied from the interleaver 20; and a multi-value modulation mapping circuit 40 causes the hamming distance of input bits in the convolutional coder 30 as the distance between signal point on the I/Q plane is smaller to subject data of 3 bits supplied from the convolutional coder 30 to mapping.

75 Claims, 26 Drawing Sheets

OTHER PUBLICATIONS

Benedetto S et al: "Serial concatenated trellis coded modulation with iterative decoding" Information Theory. 1997. Proceedings., 1997 IEEE International Symposium on ULM, Germany Jun. 29–Jul. 4, 1997, New York, NY, USA, IEEE, US, Jun. 29, 1997, p. 8, XP010240061ISBN: 0–7803–3956–8.

Benedetto S et al: "Serial concatenation of interleaved codes: performance analysis, design and iterative decoding" Information Theory. 1997. Proceedings., 1997 IEEE International Symposium on ULM, Germany Jun. 29–Jul. 4, 1997, New York, NY, USA, IEEE, US, Jun. 29, 1997, p. 106, XP010240159 ISBN: 0–7803–3956–8.

Divsalar D et al: "Serial and Hybrid Concatenated Codes With Applications" International Symposium on Turbo Codes, XX, XX, Sep. 1997, pp. 80–87, XP001034844.

Ho M Ed—Fargues M P et al: "Performance bounds for serially–concatenated trellis–coded modulation" Signals, Systems & Computers, 1997. Conference Record of the Thirsty–First Asilomar Conference on Pacific Grove, CA, USA Nov. 2–5, 1997, Los Alamitos, CA, USA,IEEE Comput. Soc, US, Nov. 2, 1997, pp. 1364–1368, XP010280612 ISBN: 0–8186–8316–3.

Keang–Po Ho et al: "Soft–decoding combined trellis–coded quantization/modulation" Communication Theory, vol. 5, Dec. 5, 1999, pp. 2451–2455, XP010373393.

Franz V et al: "Concatenated Decoding With a Reduced–Search BCJR Algorithm" IEEE Journal on Selected Areas in Communications, IEEE Inc. New York, US, vol. 16, No. 2, Feb. 1, 1998, pp. 186–195, XP000741773 ISSN: 0733–8716.

* cited by examiner

CODING APPARATUS, CODING METHOD AND RECORDING MEDIUM HAVING CODED PROGRAM RECORDED THEREIN, AND DECODING APPARATUS, DECODING METHOD AND RECORDING MEDIUM HAVING DECODED PROGRAM RECORDED THEREIN

BACKGROUND OF THE INVENTION

1. Field of the Invention

The present invention relates to a coding apparatus for carrying out serial concatenated trellis coded modulation, a coding method and a recording medium having a coded program recorded therein, and a decoding apparatus for decoding data subjected to serial concatenated trellis coded modulation, a decoding method and a recording medium having a decoded program recorded therein.

2. Description of Related Art

Lately, the study on, for example, a communication field such as a mobile communication and a deep space communication, a broadcasting field such as terrestrial wave or satellite digital broadcasting, and a magnetic, light or photo-electro recording field has been progressed materially, but with this, the study on a code theory for the purpose of making error correction coding and decoding efficient has been carried out actively.

As a theoretical limit of code performance, a Shannon limit implied by a so-called Shannon's channel coding theorem is known.

As the coding method indicative of the performance close to the Shannon limit, there is known a coding method by serially concatenated convolutional codes described in, for example, [S. Benedetto, G. Montorsi, D. Divsalar, F. Pollara, "Serial Concatenation of Interleaved Codes: Performance Analysis, Design, and Iterative Decoding", TDA Progress 42-126, Jet Propulsion Laboratory, Pasadena, Calif., Aug. 15, 1996].

The coding by the serially concatenated convolutional codes is carried out by an apparatus having two convolutional coders and an interleaver serially concatenated. The decoding by the serially concatenated convolutional codes is carried out by an apparatus having two decoding circuits for outputting a soft-output serially concatenated, and information is transferred between the two decoding circuits to obtain the final decoded result.

Further, as an application of the coding by the serially concatenated convolutional codes, there is also known a serial concatenated trellis coded modulation, which is hereinafter referred to as SCTCM, described in, for example, [D. Divsalar, F. Pollars, "Serial and Hybrid Concatenation Codes with Applications", in Proc., Int. Symp. On Turbo Codes and Related Topics, Brest, France, pp. 80–87, September 1997]. The SCTCM system comprises a combination of the coding by the serially concatenated convolutional codes and a multi-value modulation, which collectively considers an arrangement of a signal point of a modulation signal and the decoding feature of an error correction code.

The coding apparatus for carrying out coding according to th SCTCM system and the decoding apparatus for carrying out decoding according to th SCTCM system will be described hereinafter. In the following description, a contemplation is made of a case in which as shown in FIG. 1, digital information is subjected to serially concatenated convolutional coding by a coder 201 provided on a transmission device not shown, which output is input into a receiving apparatus not shown through a memoryless channel 202 with noises, which is decoded by a decoder 203 provided on the receiving apparatus.

As the coding apparatus 201 for carrying out coding according to th SCTCM system, there has been proposed an apparatus comprising a convolutional coder 210 for carrying out coding of a first code (hereinafter referred to as an outer code), an interleaver 220 for rearranging order of data input, a convolutional coder 230 for carrying out coding of a second code (hereinafter referred to as an inner code), a multi-value modulation mapping circuit 240 for carrying out mapping of a signal point on the basis of a predetermined modulation system, and a demultiplexer 250 for demultiplexing an output from the multi-value modulation mapping circuit 240, as shown in FIG. 2. The coding apparatus 201 carries out serially concatenated convolutional operation whose code rate is "4/6=2/3" with respect to input data D201 of 4-bit input, which is converted to coded data D204 of 6-bit and subjected to mapping to, for example, a transmission symbol of a 8 PSK (8-Phase Shift Keying) modulation system to obtain two transmission symbols D205 of 3 bits, which are output as a coded transmission symbol D206 one by one.

The convolutional coder 210 comprises, as shown in FIG. 3, three shift registers 211, 212, 213, and five exclusive OR circuits 214, 215, 216, 217, 218.

The shift register 211 continues to supply data of 1 bit being held to the exclusive OR circuits 214, 215, 216, 217. The shift register 211 is synchronized with a clock to newly hold an input data $D201_1$ of 1 bit out of input data D201 of 4 bits, and newly supplies the input data $201_1$ to the exclusive OR circuits 214, 215, 216, 217.

The shift register 212 continues to supply data of 1 bit being held to the exclusive OR circuits 217, 218. The shift register 212 is synchronized with a clock to newly hold an input data $D201_2$ of 1 bit out of input data D201 of 4 bits, and newly supplies the input data $201_2$ to the exclusive OR circuits 217, 218.

The shift register 213 continues to supply data of 1 bit being held to the exclusive OR circuits 214, 215. The shift register 213 is synchronized with a clock to newly hold an input data $D201_3$ of 1 bit out of input data D201 of 4 bits, and newly supplies the input data $D201_3$ to the exclusive OR circuits 214, 215.

The exclusive OR circuit 214 uses data supplied from the shift register 211, data supplied from the shift register 212, data supplied from the shift register 213, an input data $D201_4$ of 1 bit out of input data D201 of 4 bits to carry out exclusive OR operation to output the operation result to the interleaver 220 in the later stage as a coded data $D202_1$ of 1 bit out of coded data D202 of 5 bits.

The exclusive OR circuit 215 uses data supplied from the shift register 211, data supplied from the shift register 213, and an input data $D201_4$ to carry out exclusive OR operation to output the operation result to the interleaver 220 in the later stage as a coded data $D202_2$ of 1 bit out of coded data D202 of 5 bits.

The exclusive OR circuit 216 uses data supplied from the shift register 211, data supplied from the shift register 212, and input data $D201_3$, $201_4$ to carry out exclusive OR operation to output the operation result to the interleaver 220 in the later stage as a coded data $D202_3$ of 1 bit out of coded data D202 of 5 bits.

The exclusive OR circuit 217 uses data supplied from the shift register 211, and input data $D201_2$, $D201_3$ to carry out exclusive OR operation to output the operation result to the interleaver 220 in the later stage as a coded data $D202_4$ of 1 bit out of coded data D202 of 5 bits.

The exclusive OR circuit 218 uses input data $D201_1$, $D201_2$, $D201_4$ to carry out exclusive OR operation to output the operation result to the interleaver 220 in the later stage as a coded data $D202_5$ of 1 bit out of coded data D202 of 5 bits.

The convolutional coder 210 as described, when input data $D201_1$, $D201_2$, $D201_3$, $D201_4$ of 4 bits are input, carries out convolutional operation with respect to these $D201_1$, $D201_2$, $D201_3$, $D201_4$ and outputs the operation result to an interleaver 220 in the later stage as coded data $D202_1$, $D202_2$, $D202_3$, $D202_4$. That is, the convolutional coder 210 carries out convolutional operation whose code rate is "4/5" as coding of an outer code, and outputs the coded data D202 to the interleaver 220 in the later stage.

The interleaver 220 comprises, as shown in FIG. 4, an input data holding memory 221 for holding data input, a data exchange circuit 222 for carrying out rearrangement (exchange) of order of data input, an exchange data ROM (Read only Memory) 223 for supplying exchange position information of data, and an output data holding memory 224 for holding data output.

The input data holding memory 221 holds coded data D202 comprising five bit series output from the convolutional coder 210 to supply these coded data 202 to the data exchange circuit 222 at a predetermined timing.

The data exchange circuit 222 carries out rearrangement of order of the coded data D202 supplied from the input data holding memory 221 on the basis of exchange position information of data stored in the data exchange circuit 222. The data exchange circuit 222 supplies the rearranged data to the output data holding memory 224.

The exchange data ROM 223 stores, for example, exchange position information of data decided on the basis of random number generated. That is, the interleaver 220 is constituted by a random interleaver for carrying out interleave on the basis of the exchange position information. The exchange position information stored in the exchange data ROM 223 is read out by the data exchange circuit 222 at will.

The output data holding memory 224 holds data supplied from the data exchange circuit 222, and outputs these data to the convolutional coder 230 in the later stage at a predetermined timing as interleave data D203 comprising five bit series.

The interleaver 220 as described applies interleave to the coded data D202 comprising five bit series output from the convolutional coder 210 to output the produced interleave data D203 comprising five bit series to the convolutional coder 230 in the later stage.

The convolutional coder 230 comprises, as shown in FIG. 5, five exclusive OR circuits 231, 232, 233, 234, 235, and one shift register 236.

The exclusive OR circuit 231 uses interleave data $D203_1$, $D203_2$ of 2 bits out of interleave data D203 of 5 bits to carry out exclusive OR operation, and supplies the operation result to the exclusive OR circuit 232.

The exclusive OR circuit 231 uses interleave data D2033 of 1 bit out of interleave data D203 of 5 bits, and data supplied from the exclusive OR circuit 231 to carry out exclusive OR operation, and supplies the operation result to the exclusive OR circuit 233.

The exclusive OR circuit 233 uses interleave data $D203_4$ of 1 bit out of interleave data D203 of 5 bits, and data supplied from the exclusive OR circuit 232 to carry out exclusive OR operation, and supplies the operation result to the exclusive OR circuit 234.

The exclusive OR circuit 234 uses interleave data $D203_5$ of 1 bit out of interleave data D203 of 5 bits, and data supplied from the exclusive OR circuit 233 to carry out exclusive OR operation, and supplies the operation result to the exclusive OR circuit 235, and outputs it the multi-value modulation mapping circuit 240 in the later stage as coded data $D204_6$ of 1 bit out of coded data D204 of 6 bits.

The exclusive OR circuit 235 uses data supplied from the exclusive OR circuit 234, and data supplied from the shift register 236 to carry out exclusive OR operation, and supplies the operation result to the shift register 236, and outputs it the multi-value modulation mapping circuit 240 in the later stage as coded data $D204_3$ of 1 bit out of coded data D204 of 6 bits.

The shift register 236 continues to supply data of 1 bit being held to the exclusive OR circuit 235. The shift register 236 is synchronized with a clock to newly hold data of 1 bit, and newly supplies that data to the exclusive OR circuit 235.

The convolutional coder 230 as described outputs, when interleave data $D203_1$, $D203_2$, $D203_3$, $D203_4$, $D203_5$ are input, the interleave data $D203_1$, $D203_2$, $D203_3$, $D203_4$, $D203_5$ to the multi-value modulation mapping circuit 240 in the later stage as coded data $D204_1$, $D204_2$, $D204_3$, $D204_4$, $D204_5$. The convolutional coder 230 carries out convolutional operation with respect to the interleave data $D203_1$, $D203_2$, $D203_3$, $D203_4$, $D203_5$, and outputs the operation result to the multi-value modulation mapping circuit 240 in the later stage as coded data $D204_3$, $D204_6$. That is, the convolutional coder 230 carries out convolutional operation whose code rate is "5/6" as coding of inner codes to output coded data D204 to the multi-value modulation mapping circuit 240 in the later stage.

The multi-value modulation mapping circuit 240 causes the coded data D204 output from the convolutional coder 230 to synchronize with a clock to apply mapping, for example, to a transmission symbol of the 8 PSK modulation system. Since a signal point of one transmission symbol in the 8 PSK modulation system is data of 3 bits, the multi-value modulation mapping circuit 240 carries out mapping with respect to coded data of 3 bits out of coded data D204 of 6 bits output from the convolutional coder 230 as one transmission symbol to produce two transmission symbols D203. The multi-value modulation mapping circuit 240 outputs the produced transmission symbols D205 to the demultiplexer 250 in the later stage.

The demultiplexer 250 demultipexes two transmission symbols D205 output from the multi-value modulation mapping circuit 240. The demultiplexer 250 is synchronized with a clock of a period of ½ of a clock when the transmission symbol D205 is produced by the multi-value modulation mapping circuit 240 to output to the outside as coded transmission symbols D206 one by one.

The coding apparatus 201 as described carries out convolutional operation whose code rate is "4/5" as coding of outer codes by the convolutional coder 210, and convolutional operation whose code rate is "5/6" as coding of inner codes is carried out by the convolutional coder 230, whereby carrying out serially concatenated convolutional operation whose code rate is "(4/5)×(5×6)=4/6=2/3" as a whole. Data coded and modulated by the coding apparatus 201 are output to the receiving apparatus through the memoryless channel 202.

On the other hand, the decoding apparatus 2 for carrying out decoding of the SCTCM system by the coding apparatus 201 comprises, for example, as shown in FIG. 6, a multiplexer 260 for multiplexing a reception word D207 received, a soft-output decoding circuit 270 for carrying out decoding of inner codes, a deinterleaver 280 for returning order of data input to the original state, an interleaver 290 for rearranging order of data input, and a soft-output decoding circuit 300 for carrying out decoding of outer codes. The decoding apparatus 203 presumes input data D201 in the coding apparatus 201 from the reception word D207 which takes an analog value and which is to be a soft-input due to the influence of noises generated on the memoryless channel 202 to output it as decoded data D213.

The multiplexer 260 outputs two reception words corresponding as one transmission symbol out of reception words D207 of soft-input received by the receiving apparatus to the soft-output decoding circuit 270 in the later stage The soft-output decoding circuit 270 is provided corresponding to the convolutional coder 230 in the coding apparatus 201 to carry out MAP (Maximum A Posteriori probability) decoding based on the so-called BCJR (Bahl, Cocke, Jelinek and Reviv) algorithm and SOVA (Soft Output Viterbi Algorithm) decoding. The soft-output decoding circuit 270 inputs two reception words D208 of soft-input supplied from the multiplexer 260, inputs priori probability information D209 with respect to information bit of soft-input supplied from the interleaver 290, and uses the reception words D208 and the priori probability information D209 to carry out soft-output decoding of inner codes. The soft-output decoding circuit 270 produces extrinsic information D210 with respect to information bit obtained according to the constraint condition of codes, and outputs the extrinsic information D210 to the deinterleaver 280 in the later stage as a soft-output. It is noted that the extrinsic information D210 corresponds to interleave data D203 interleave by the interleaver 220.

The deinterleaver 280 applies deinterleave to the extrinsic information D210 of soft-input output from the soft-output decoding circuit 270 so that a bit array of interleave data D203 interleaved by the interleaver 220 in the coding apparatus 201 is returned to the original bit array of the coded data D202. The deinterleaver 280 outputs data obtained by deinterleaving as priori probability information D211 with respect to the code bit in the soft-output decoding circuit 300 in the later stage.

The interleaver 290 applies the interleave based on the same exchange position information as the interleaver 220 in the coding apparatus 201 with respect to the extrinsic information 212 with respect to the code bit of soft-input output from the soft-output decoding circuit 300. The interleaver 290 outputs data obtained by interleaving as the priori probability information D209 with respect to the information bit in the soft-output decoding circuit 270.

The soft-output decoding circuit 300 is provided corresponding to the convolutional coder 210 in the coding apparatus 201, and carries out MAP decoding on the basis of the aforementioned BCJR algorithm and SOVA decoding similar to the soft-output decoding circuit 270. The soft-output decoding circuit 300 inputs the priori probability information D211 with respect to the code bit of soft-input output from the deinterleaver 280, inputs priori probability information with respect to the information bit whose value is "0", though not shown, and uses these priori probability information to carry out soft-output decoding of outer codes. And, the soft-output decoding circuit 300 produces the extrinsic information D212 with respect to the code bit obtained according to the constraint condition of codes, and outputs the extrinsic information D212 to the interleaver 290 as a soft-output. Further, the soft-output decoding circuit 300 produces the extrinsic information with respect to the information bit obtained according to the constraint condition of codes, and outputs decoded data D213 of hard-soft on the basis of the extrinsic information.

The decoding apparatus 203 as described carries out, when the reception word D207 is received, decoding operation from the soft-output decoding circuit 270 to the soft-output decoding circuit 300 iteratively by the predetermined number of times, for example, several or scores of times to output the decoded data D213 on the basis of the extrinsic information of soft-output obtained as a result of the predetermined number of times of the decoding operation.

Incidentally, the coding apparatus 201 has a problem, since there are many bits need be processed in various parts, of bringing forth complicatedness of constitution of various parts and making a circuit scale huge. Further, the decoding apparatus 203 is also complicated in constitution of various parts with the complicatedness of the coding apparatus 201. For solving this problem, there have been proposed a coding apparatus 401 shown in FIGS. 7 and 9, and a decoding apparatus 403 shown in FIG. 10. The coding apparatus 401 and the decoding apparatus 403 will be described hereinafter. Needless to say, the coding apparatus 401 and the decoding apparatus 403 take the place of the coding apparatus 201 and the decoding apparatus 203 in the communication model shown in FIG. 1 previously.

The coding apparatus 401 comprises, as shown in FIG. 7, a convolutional coder 410 for carrying out coding of outer codes, an interleaver 420 for rearranging order of data input, a convolutional coder 430 for carrying out coding of inner codes, and a multi-value modulation mapping circuit 440 for carrying out mapping of signal points base on the predetermined modulation system. The coding apparatus 401 carries out serially concatenated convolutional operation whose code rate is "2/3" with respect to the input data D401 of 2 bits input to convert it into coded data D404 of 3 bits, and applies mapping to a transmission symbol of the 8 PSK modulation system, for example, to output it as one coded transmission symbol D405 of 3 bits.

The convolutional coder 410 comprises, as shown in FIG. 8, three exclusive OR circuits 411, 413, 415, and two shift registers 412, 414.

The exclusive OR circuit 411 uses input data $D401_1$, $401_2$ of 2 bits to carry out exclusive OR operation and supplies the operation result to the shift register 412.

The shift register 412 continues to supply data of 1 bit being held to the exclusive OR circuit 413. The shift register 412 is synchronized with a clock to newly hold data of 1 bit supplied from the exclusive OR circuit 411, and newly supplies that data to the exclusive OR circuit 413.

The exclusive OR circuit 413 uses data supplied from the shift register 412 and input data $D401_1$ of 1 bit out of input data D401 of 2 bits to carry out exclusive OR operation to supply the operation result to the shift register 414.

The shift register 414 continues to supply data of 1 bit being held to the exclusive OR circuit 415. The shift register 414 is synchronized with a clock to newly hold data of 1 bit supplied from the exclusive OR circuit 413, and newly supplies that data to the exclusive OR circuit 415.

The exclusive OR circuit 415 uses data supplied from the shift register 414 and input data $D401_1$, $D401_2$ to carry out exclusive OR operation to supply the operation result to the interleaver 420 in the later stage as coded data $D402_3$ of 1 bit out of coded data D402 of 3 bits.

The convolutional coder 410 as described carries out, when input data D401₁ and D401₂ are input, convolutional operation with respect to these input data D401₁ and D401₂ to output the operation result tot he interleaver 420 in the later stage as coded data D402₁, D402₂, D402₃. That is, the convolutional coder 410 carries out convolutional operation whose code rate is "2/3" as coding of outer codes and outputs coded data D402 to the interleaver 420 in the later stage.

The interleaver 420 has the constitution similar to that of the interleaver 220 shown in FIG. 4 previously, and the size thereof is reduced to be smaller than the interleaver 220. That is, the interleaver 420 is reduced in circuit scale as compared with the interleaver 220 since input/output of 3 bits is carried out in place of input/output of 5 bits. The interleaver 420 inputs coded data D402 comprising three bit series output from the convolutional coder 410, and rearranges order of bits constituting the coded data D402 on the basis of exchange position information stored in advance to produce the interleave data D403.

The convolutional coder 430 comprises, as shown in FIG. 9, an exclusive OR circuit 431 and a shift register 432.

The exclusive OR circuit 431 uses interleave data D403₁, D403₂, D403₃ to carry out exclusive OR operation to output the operation result to the multi-value modulation mapping circuit 440 in the later stage as coded data D404₃ of 1 bit out of coded data D404 of 3 bits and supply it to the shift register 432.

The shift register 432 continues to supply data of 1 bit being held to the exclusive OR circuit 431. The shift register 432 is synchronized with a clock to newly hold data of 1 bit supplied from the exclusive OR circuit 431, and newly supplies that data to the exclusive OR circuit 431.

The convolutional coder 430 carries out, when the interleave data D403₁, D403₂, D403₃ are input, convolutional operation with respect to these interleave data D403₁, D403₂, D403₃ to output the operation result to the multi-value modulation mapping circuit 440 as coded data D404₁, D404₂, D404₃ of 3 bits. That is, the convolutional coder 430 carries out convolutional operation whose code rate is "3/3=1" as coding of inner codes to output coded data D404 to the multi-value mapping circuit 440.

The multi-value mapping circuit 440 causes coded data D404 output from the convolutional coder 430 to synchronize with a clock to apply mapping thereto to a transmission symbol of the 8 PSK modulation system, for example. The multi-value mapping circuit 440 carries out mapping with respect to coded data D404 of 3 bits output from the convolutional coder 430 as one transmission symbol to produce one coded transmission symbol D405. The multi-value mapping circuit 440 outputs the produced coded transmission symbol D405 to the outside.

The coding apparatus 401 as described carries out convolutional operation whose code rate is "2/3" as coding of outer codes by the convolutional coder 410, and convolutional operation whose code rate is "1" as coding of inner codes is carried out by the convolutional coder 430, whereby carrying out serially concatenated convolutional operation whose code rate is "(2/3)×1=2/3" as a whole. That is, the coding apparatus 401 is able to hold the code rate as the same "2/3" despite the simple constitution as compared with the coding apparatus 201 since the number of bits need be processed in various parts will suffice to be small. Data coded and modulated by the coding apparatus 401 are output to the receiving apparatus through the memoryless channel 202.

On the other hand, the decoding apparatus 403 comprises, as shown in FIG. 10, a soft-output decoding circuit 450 for carrying out decoding of inner codes, a deinterleaver 460 for returning order of data input to the original state, an interleaver 470 for rearranging order of data input, and a soft-output decoding circuit 480 for carrying out decoding of outer codes. The decoding apparatus 403 presumes input data D401 in the coding apparatus 401 from a reception word D406 which takes an analog value and which is to be a soft-input due to the influence of noises generated on the memoryless channel 202 to output it as decoded data D411.

The soft-output decoding circuit 450 is provided correspondingly to the convolutional coder 410 in the coding apparatus 40, and carries out MAP decoding on the basis of the aforementioned BCJR algorithm or SOVA decoding. The soft-output decoding circuit 450 inputs a reception word D406 received by the receiving apparatus inputs priori probability information D407 with respect to the information bit of soft-input supplied from the interleaver 470, and uses these reception word D406 and priori probability information D407 to carry out soft-output decoding of inner codes. The soft-output decoding circuit 450 produces extrinsic information D408 with respect to the information bit obtained according to the constraint condition of codes to output the extrinsic information D408 to the interleaver 460 in the later stage as a soft-output. The extrinsic information D408 corresponds to the interleave data D403 interleaved by the interleaver 420 in the coding apparatus 401.

The deinterleaver 460 applies the deinterleave to the extrinsic information D408 of soft-input output from the soft-output decoding circuit 450 so that the bit array of the interleave data D403 interleaved by the interleaver 420 in the coding apparatus 401 is returned to the original bit array of the coded data D402. The deinterleaver 460 outputs data obtained by deinterleaving as priori probability information D409 with respect to the coded bit in the soft-output decoding circuit 480 in the later stage.

The interleaver 470 applies the interleave base on the same exchange position information as the interleaver 420 in the coding apparatus 401 with respect to the extrinsic information D410 with respect to the code bit which is output from the soft-output decoding circuit 480 and which is to be a soft-input. The interleaver 470 outputs data obtained by interleaving as priori probability information D407 with respect to the information bit in the soft-output decoding circuit 450.

The soft-output decoding circuit 480 is provided correspondingly to the convolutional coder 419 in the coding apparatus 401, and carries out MAP decoding based on the aforementioned BCRJ algorithm or SOVA decoding similar to the soft-output decoding circuit 450. The soft-output decoding circuit 480 inputs priori probability information D409 with respect to the code bit of soft-input output from the deinterleaver 460, inputs priori probability information with respect to the information bit whose value is "0", though not shown, and uses these priori probability information to carry out soft-output decoding of outer codes. The soft-output decoding circuit 480 produces extrinsic information D410 with respect to the code bit obtained according to the constraint condition of codes, and outputs the extrinsic information D410 to the interleaver 470 as a soft-output. Further, The soft-output decoding circuit 480 produces extrinsic information with respect to the information bit obtained according to the constraint condition of codes, and outputs decoded data D411 on the basis of the extrinsic information though not shown.

The decoding apparatus 403 as described carries out, when the reception word D406 is received, decoding operation from the soft-output decoding circuit 450 to the soft-output decoding circuit 480 iteratively by the predetermined number of times, for example, several or scores of times to output the decoded data D411 on the basis of the extrinsic information of soft-output obtained as a result of the predetermined number of times of the decoding operation. That is, the decoding apparatus 403 is able to carry out decoding of the received reception word D406 with the simple constitution as compared with the decoding apparatus 203 since the number of bits of input/output with respect to various parts is small.

As described above, the system composed of the coding apparatus 401 and the decoding apparatus 403 is reduced in circuit scale of various parts as compared with the system composed of the coding apparatus 201 and the decoding apparatus 203.

As described above, the system composed of the coding apparatus 401 and the decoding apparatus 403 is able to carry out error correction coding and decoding rate as compared with the system composed of the coding apparatus 201 and the decoding apparatus 203, but poses a problem that the performance is somewhat poor.

For the purpose of explaining concretely, FIG. 11 shows the performance curve given by a relationship between an logarithm expression ($\log_{10}$BER) and a signal/noise power ratio (Eb/No) per 1 bit. In the figure, both the multi-value mapping circuit 240 in the coding apparatus 201 and the multi-value mapping circuit 440 in the coding apparatus 401 carry out mapping with respect to signal points, and makes the input distance sum of the minimum Euclidean distance "16", as shown in FIG. 12.

As will be apparent from FIG. 11, it is understood that the performance curve in the system composed of the coding apparatus 201 and the decoding apparatus 203 presents the so-called water fall phenomenon in the range from about 3 dB to about 3.5 dB relative to Eb/No, and presents the so-called error floor phenomenon in the range of about 3.5 dB or more relative to Eb/No. On the other hand, it is understood that the performance curve in the system composed of the coding apparatus 401 and the decoding apparatus 403 will be a water fall region in the high range of about 0.3 dB relative to Eb/No as compared with the performance curve in the system composed of the coding apparatus 201 and the decoding apparatus 203. This indicates that the system composed of the coding apparatus 201 and the decoding apparatus 203 has the coded gain of about 0.3 dB as compared with the system composed of the coding apparatus 401 and the decoding apparatus 403. It is understood therefrom that the system composed of the coding apparatus 401 and the decoding apparatus 403 is lower in the performance than the system composed of the coding apparatus 201 and the decoding apparatus 203, and actually there still remains room m for improvement.

SUMMARY OF THE INVENTION

The present invention has been accomplished in view of the actual conditions as noted above. It is an object of the present invention to provide a coding apparatus capable of carrying out coding and decoding under the high performance, a coding method and a recording medium having a coded program recorded therein, and a decoding apparatus, a decoding method and a recording medium having a decoded program recorded therein.

A coding apparatus according to the present invention for achieving the aforementioned object is a coding apparatus for carrying out serially concatenated coded modulation with respect to data input comprising a first coding means for carrying out coding whose code rate is k/(k+1) with respect to data of k-bit input; a interleaving means for interleaving order of bits constituting data comprising a bit series of (k+1) bits coded by the first coding means; a second coding means serially concatenated with the interleaving means to carry out coding whose code rate is 1 with respect to data of (k+1) bit input; and a mapping means for mapping data of (k+1) bit coded by the second coding means to a transmission symbol of a predetermined modulation system, wherein the interleaving means interleaves order of bits so that at least a part of weights with respect to data comprising a bit series of (k+1) bit supplied from the first coding means are coded by the second coding means; the second coding means makes as small as possible the total value of the hamming distance of input bits between passes to be the minimum Euclidean distance with respect to data of (k+1) bit supplied from the interleaving means; and the mapping means causes the hamming distance of input bits in the second coding means to correspond to a small one as the distance between signal points on the I/Q plane is smaller to apply mapping to data of (k+1) bit supplied from the second coding means.

Further, a coding method according to the present invention for achieving the aforementioned object is a coding method for carrying out serially concatenated coded modulation with respect to data input comprising a first coding step for carrying out coding whose code rate is k/(k+1) with respect to data of k-bit input; an interleaving step for interleaving order of bits constituting data comprising a bit series of (k+1) bits coded by the first coding step; a second coding step for carrying out coding whose code rate is 1 with respect to data of (k+1) bit rearranged by the interleaving step and input; and a mapping step for mapping data of (k+1) bit coded by the second coding step to a transmission symbol of a predetermined modulation system, wherein the interleaving step interleaves order of bits so that at least a part of weights with respect to data comprising a bit series of (k+1) bit supplied from the first coding step are coded by the second coding step; the second coding step makes as small as possible the total value of the hamming distance of input bits between passes to be the minimum Euclidean distance with respect to data of (k+1) bit supplied from the interleaving step; and the mapping step causes the hamming distance of input bits in the second coding step to correspond to a small one as the distance between signal points on the I/Q plane is smaller to apply mapping to data of (k+1) bit supplied from the second coding step.

Furthermore, a decoding apparatus according to the present invention for achieving the aforementioned object is a decoding apparatus for decoding of codes subjected to serially concatenated coded modulation generated by coding equipment, the coding equipment comprises a first coding means for carrying out coding whose code rate is k/(k+1) with respect to data of k-bit input; a first interleaving means for interleaving order of bits constituting data comprising a bit series of (k+1) bits coded by the first coding means; a second coding means serially concatenated with the first interleaving means to carry out coding whose code rate is 1 with respect to data of (k+1) bit input; and a mapping means for mapping data of (k+1) bit coded by the second coding means to a transmission symbol of a predetermined modulation system, wherein the first interleaving means interleaves order of bits so that at least a part of weights with respect to data comprising a bit series of (k+1) bits supplied from the first coding means are coded by the second coding means; the second coding means makes as small as possible the total value of the hamming distance of input bit between passes to be the minimum Euclidean distance with respect to the data of (k+1) bits supplied from the first interleaving means; the mapping means causes the hamming distance of input bits in the second coding means to correspond to a small one as the distance between signal points on the I/Q plane is smaller to apply mapping to data of (k+1) bits supplied from said second coding means, the decoding apparatus comprising a first soft-output decoding means for carrying out soft-output decoding using a reception word which is a soft-input and priori probability information with respect to the information bit of (k+1) bits which are a soft-input to carry out soft-output decoding; a deinterleaving means serially concatenated with the first soft-output decoding means to rearrange data of (k+1) bits of soft-input so that a bit array of data of (k+1) bit rearranged by the first interleaving means is returned to a bit array of data of (k+1) bits coded by the first coding means; a second soft-output decoding means provided corresponding to the first coding means and serially concatenated with the deinterleaving means to carry out soft-output decoding using priori probability information with respect to code bits of (k+1) bits which are a soft-input output from the deinterleaving means; and a second interleaving means for interleaving order of bits constituting data comprising a bit series of (k+1) bits output from the second soft-output decoding means on the basis of the same exchange position information as the first interleaving means, wherein the first soft-output decoding means inputs data of soft-input output from the second interleaving means as priori probability information with respect to information bit.

Further, a decoding method according to the present invention for achieving the aforementioned object is a decoding method for carrying out decoding of codes subjected to serially concatenated coded modulation generated by a coding method, the coding method comprising a first coding step for carrying out coding whose code rate is k/(k+1) with respect to data of k-bit input; a first interleaving step for interleaving order of bits constituting data comprising a bit series of (k+1) bits coded by the first coding step; a second coding step for carrying out coding whose code rate is 1 with respect to data of (k+1) bit rearranged by the first interleaving step and input; and a mapping step for mapping data of (k+1) bit coded by the second coding step to a transmission symbol of a predetermined modulation system, wherein the interleaving step interleaves order of bits so that at least a part of weights with respect to data comprising a bit series of (k+1) bit coded by the first coding step are coded by the second coding step; the second coding step makes as small as possible the total value of the hamming distance of input bits between passes to be the minimum Euclidean distance with respect to data of (k+1) bit rearranged by the first interleaving step; and the mapping step causes the hamming distance of input bits in the second coding step to correspond to a small one as the distance between signal points on the I/Q plane is smaller to apply mapping to data of (k+1) bit coded by the second coding step, the decoding method comprising a first soft-output decoding step, corresponding to the second coding step, to carry out soft-output decoding using a reception word which is a soft-input, and priori probability information with respect to information bits of (k+1) bits which are a soft-input; a deinterleaving step for rearranging data of (k+1) bits of a soft-input so that a bit array of data of (k+1) bits rearranged by the first interleaving step is returned to a bit array of data of (k+1) bits coded by the first coding means; a second soft-output decoding step, corresponding to the coding step, to carry out soft-output decoding using priori probability information with respect to code bits of (k+1) bits which are a soft-input rearranged by the deinterleaving step, and priori probability information with respect to information bits of (k+1) bits which are a soft-input; and the second interleaving step for interleaving order of bits constituting data comprising a bit series of (k+1) pieces of a soft-input produced by the second soft-output decoding step on the basis of the same exchange position information as that of the first interleaving step, wherein the first soft-output decoding step inputs data of soft-input rearranged by the second interleaving step as priori probability information with respect to information bit.

DESCRIPTION OF THE PREFERRED EMBODIMENTS

Preferred embodiments to which is applied the present invention will be described in detail with reference to the accompanying drawings.

Figure 13:
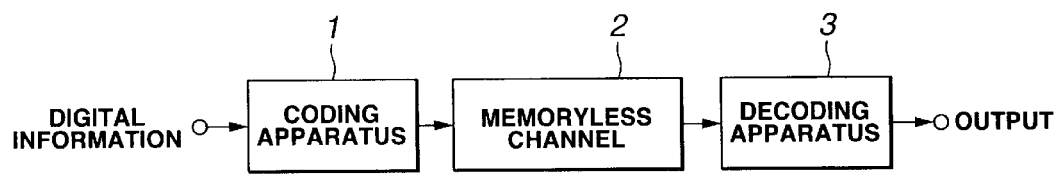
FIG. 13 is a block diagram for explaining the constitution of a communication model to which is applied a data transmit-receive system according to an embodiment of the present invention.

This embodiment is concerned with a data transmit-receive system applied to a communication model in which as shown in FIG. 13, digital information is coded by a coding apparatus 1 provided on a transmission apparatus not shown, output of which is input into a receiving apparatus not shown through a memoryless channel 2 with noises, and the output is decoded by a decoding apparatus 3 provided on the receiving apparatus.

In the data transmit-receive system, the coding apparatus 1 carries out coding according to a serial concatenated trellis coded modulation, which is hereinafter referred to as SCTCM, system, in which as a first coding of a code (hereinafter referred to as an outer code), a convolutional operation whose code rate is "2/3" is carried out, and as a second coding of a code (hereinafter referred to as an inner code), a convolutional operation whose code rate is "3/3=1", is carried out. Particularly, in the coding apparatus 1, when the coding of inner code is carried out, the total value of the hamming distance of input bits between passes to be the minimum Euclidean distance is made as small as possible, the optimum signal point arrangement is provided at the time of modulation, and the appearance of so-called error floor in a high bit error rate is suppressed, as described later. Further, the decoding apparatus 3 enables decoding of codes subjected to coding according to the SCTCM system by the coding apparatus 1 as described.

Figure 14:
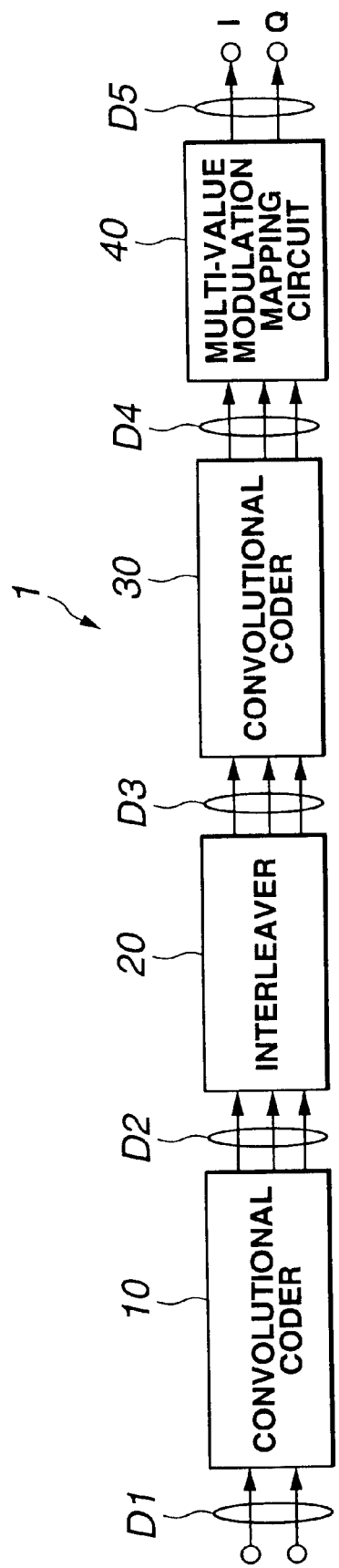
FIG. 14 is a block diagram for explaining the constitution of a coding apparatus in the data transmit-receive system.

As shown in FIG. 14, the coding apparatus 1 comprises two convolutional coders 10, 30 for carrying out convolutional operation which are a first coding means and a second coding means; an interleaver 20 which is a (first) interleaving means for rearranging order of data input; and a multi-value modulation mapping circuit 40 which is a mapping means for carrying out mapping of a signal point on the basis of a predetermined modulation system. The coding apparatus 1 carries out serial concatenated convolutional operation whose code rate is "2/3" with respect to input data D1 of 2 bits input to convert the former into coded data D4 of 3 bits, which is subjected, for example, to mapping to a transmission symbol D5 of a 8 PSK (8-phase Shift Keying) modulation system to output it as one coded transmission symbol D5 of 3 bits.

First, three conditions for realizing the coding apparatus 1 will be explained prior to the detailed description of the coding apparatus 1.

Out of three conditions for realizing the coding apparatus 1, the first condition is that when the coding of inner code is carried out, the total value of the hamming distance of input bits between passes to be the minimum Euclidean distance is made as small as possible.

In other words, since the code rate when the coding of inner code in the coding apparatus 1 is "1" as mentioned above, the minimum Euclidean distance between codes is equal to the distance between signal points when mapping of signal points is carried out on the basis of the predetermined modulation system. The first condition is to make the hamming distance of input bits when this relationship is fulfilled as small as possible.

The first condition is introduced from the fact that in the performance curve shown in a relationship between an logarithm expression ($\log_{10}$ BER) of a bit error generally used to show the code performance and a signal/noise power ratio (Eb/No), as the total value of the hamming distance of input bits between passes to be the minimum Euclidean distance is smaller, the so-called water fall region appears from the low Eb/No.

It is contemplated that for fulfilling the first condition as described above, as a convolutional coder 30 for carrying out coding of inner code, use is made of a coder in which data of at least 1 bit out of data of 3 bits to be input is output as it is without being participated in convolutional operation. That is, as the convolutional coder 30 for carrying out coding of inner code, for making the total value of the hamming distance of input bits as small as possible, data of at least 1 bit out of data of 3 bits to be input may be used as a code of a finite impulse response (abbreviated as FIR hereinafter) type, and other data may be used for recursive systematic convolutional operation as a code of an infinite impulse response (abbreviated as IIR hereinafter) type. In other words, coding is carried out in which the hamming distance of input bits is "1" and a parallel pass whose output bit is different in 1 symbol alone is present. The parallel passes termed herein mean two parallel passes which when a code series is represented by a trellis diagram, arrives from a certain state to the same state.

Out of three conditions, the second condition is that at the time of modulation, the optimum signal point arrangement is provided. In the SCTCM system, particularly, it is important to enhance the performance of the system for carrying out coding of inner code and mapping of a signal point. Generally, the probability to be error is high as the distance between signal points on the I/Q plane is smaller. Therefore, preferably, the signal point at which the probability to be error is highest is made to correspond to one in which the hamming distance of input bits of inner code when an error occurs. The second condition is introduced on the basis of such a way of thinking as described.

Figure 15A:
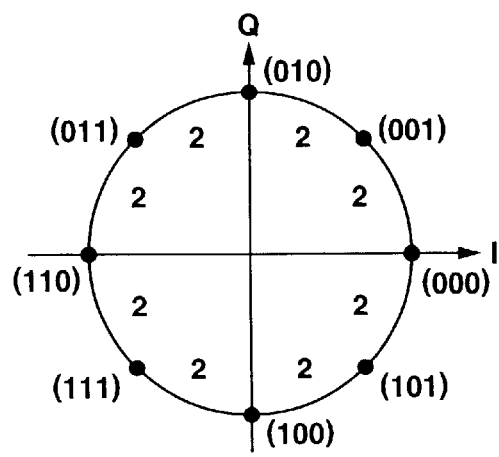
FIGS. 15A–15C are a view for explaining the signal point arrangement based on the 8 PSK modulation system, (A) showing the case where the input distance sum of the minimum Euclidean distance is "16", (B) showing the case where the input distance sum of the minimum Euclidean distance is "14", and (C) showing the case where the input distance sum of the minimum Euclidean distance is "12".
Figure 15B:
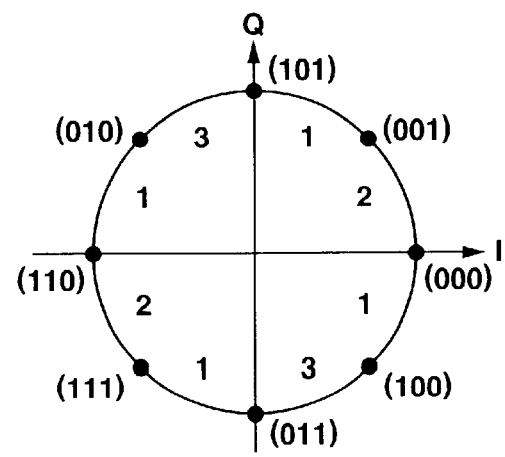
Figure 15C:
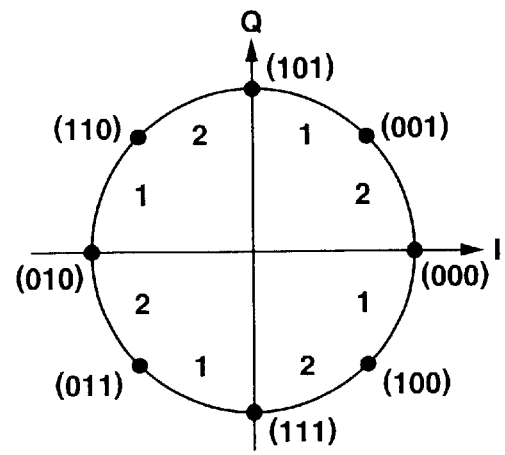

For fulfilling the second condition in consideration of the first condition, the signal point corresponding to the parallel pass at which the hamming distance of input bit described above is "1" may be arranged at a position of the minimum Euclidean distance by the multi-value modulation mapping circuit 40. Normally, in th case of the 8PSK modulation system, since the signal point is subjected to mapping as shown in FIG. 15(A), the input distance of all minimum Euclidean distances is made to be "2", and the input distance sum is not less than "16". Therefore, in the multi-value modulation mapping circuit 40, the signal point is subjected to mapping, for example, as shown in FIG. 15(B) or (C) on the basis of the 8PSK modulation system so as to fulfill the second condition. By doing so, in the multi-value modulation mapping circuit 40, the input distance sum of the minimum Euclidean distance can be made to be smaller than "16" such as to be "14" in case of FIG. 15(B), and to be "12" in case of FIG. 15(C).

The distance of the signal point depends on the inner code by the convolutional coder 30. That is, needless to say, even if the input distance sum of the minimum Euclidean distance is the same, the arrangement of the signal point is different according to the change of the constitution of the convolutional coder 30. For example, the signal point arrangement shown in FIG. 15(A) is concerned with the case where as coding of inner code, coding given by the generator matrix $G_I$ shown in the following formula (1), and the signal point arrangement shown in FIGS. 15(B) and (C) is concerned with the case where as coding of inner code, coding given by the generator matrix $G_I$ shown in the following formula (2).

$$G_I = \begin{bmatrix} 0 & 0 & 1/(1+D) \\ 1 & 0 & 1/(1+D) \\ 0 & 1 & 1/(1+D) \end{bmatrix} \quad (1)$$

$$G_I = \begin{bmatrix} 1 & 0 & 0 \\ 0 & 1 & 1/(1+D) \\ 0 & 0 & 1/(1+D) \end{bmatrix} \quad (2)$$

Figure 16:
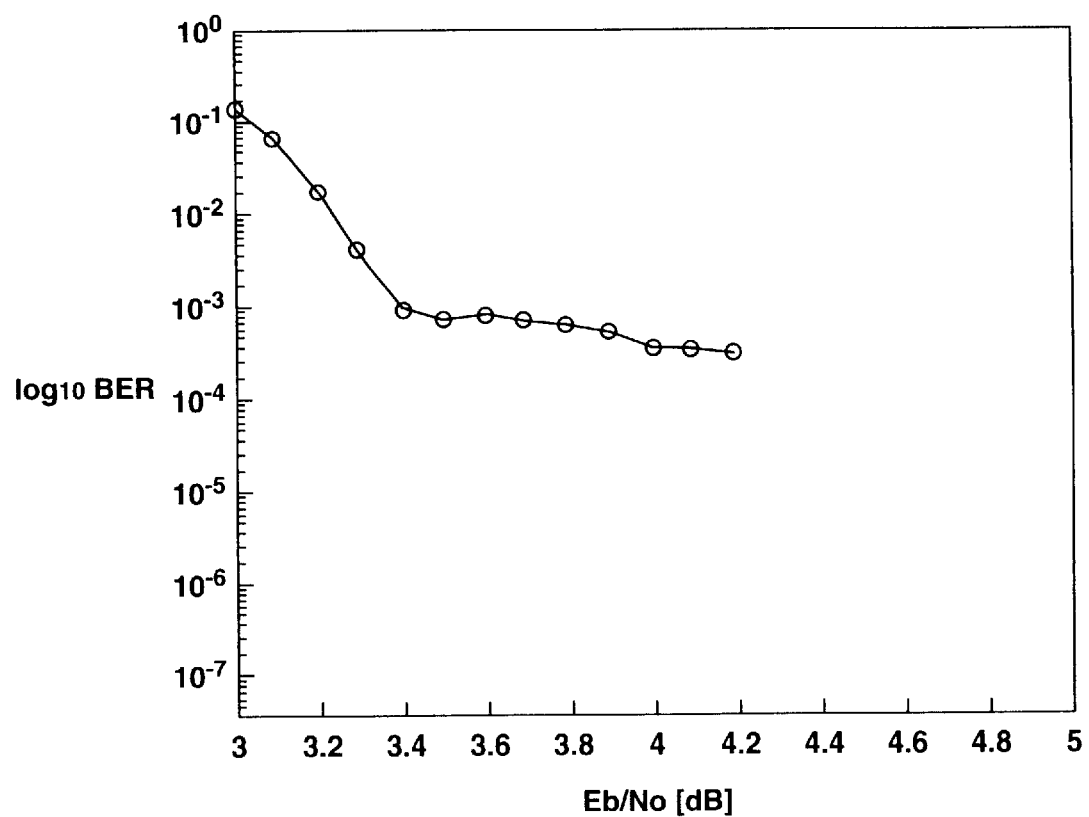
FIG. 16 is a view for explaining the performance curve in the case where a convolutional coder and a multi-value mapping circuit for carrying out coding of inner codes fulfilled with a first condition and a second condition.

Now, performance curve in the case where the convolutional coder 30 for carrying out coding of inner code and the multi-value modulation mapping circuit 40 are constituted so as to fulfill the first and second conditions as described is as shown, for example, in FIG. 16. In the figure, there is shown the performance curve in the case where as coding of outer code by the convolutional coder 10, coding given by the generator matrix $G_O$ given in the following formula (3) is carried out; as coding of outer code by the convolutional coder 30, coding given by the generator matrix $G_I$ given in the above formula (2) is carried out; and as mapping of a signal point by the multi-value modulation mapping circuit 40, mapping of a signal point is carried out with the input distance sum of the minimum Euclidean distance set to "14" as shown in FIG. 15(B).

$$G_o = \begin{bmatrix} 1 & D & 1+D \\ D^2 & 1 & 1+D+D^2 \end{bmatrix} \quad (3)$$

The performance curve shown FIG. 16 presents the water fall phenomenon from the range of low Eb/No, but presents the error floor phenomenon in which a bit error rate is at a high value of about $10^{-3}$ in an logarithm expression.

So, out of three conditions for realizing the coding apparatus 1, the third condition is introduced which suppresses the appearance of an error floor at such a high bit error floor as described.

It is contemplated, as a result that the outer code by the convolutional coder 10 is interleaved, that the cause of the appearance of the error floor is governed by $(1/3)^4$ which is the probability in which all weights of outer code is not coded by inner code, that is, the probability in which all weights where the minimum weight of outer code is "4" are output as it is without being participated in convolutional operation in the convolutional coder 30. It is generally known that the weight of outer code by the convolutional coder 10 is not concentrated on 1 bit out of data of 3 bits to be output.

From the foregoing, it may be designed so that all weights of outer code are not input as codes of the FIR type in the convolutional coder 30 in order to fulfill the third condition. It is proposed here that by applying a device to the interleaver 20, the phenomenon is avoided in which all weights of outer code are input as the FIR type code in the convolutional coder 30. As the interleaver 20 as described, various ones are contemplated, but it is contemplated as one example that the interleave is individually applied to the respective ones of data of 3 bits to be input.

Figure 17:
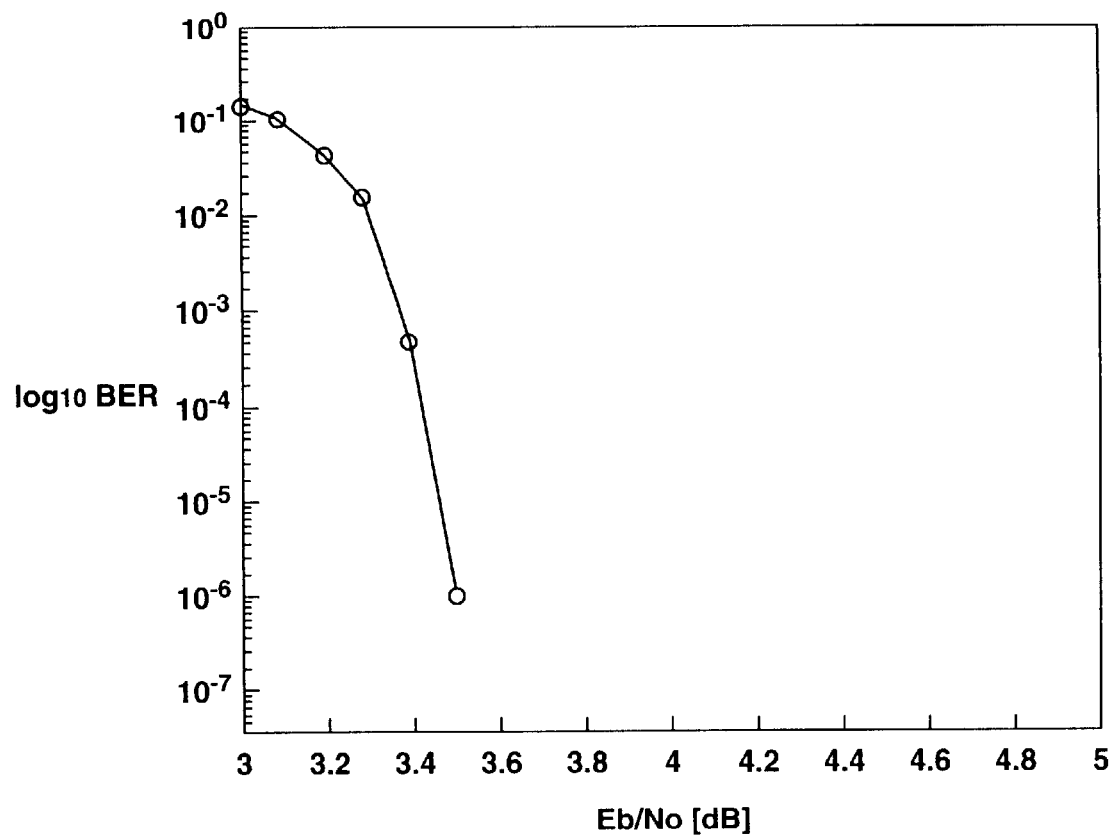
FIG. 17 is a view for explaining the performance curve in the case where an interleaver fulfilled with a third condition is used.

The performance curve obtained actually in the case where the interleave is individually applied to the respective ones of data of 3 bits to be input is, for example, as shown in FIG. 17. Also in this figure, there is shown the performance curve in the case where as coding of outer code by the convolutional coder 10, coding given by the generator matrix $G_O$ given in the above formula (3) is carried out; as coding of inner code by the convolutional coder 30, coding given by the generator matrix $G_I$ given in the above formula (2) is carried out; and as mapping of a signal point by the multi-value modulation mapping circuit 40, mapping of a signal point is carried out with the input distance sum of the minimum Euclidean distance set to "14" as shown in FIG. 15(B).

This performance curve presents the water fall phenomenon from the range of low Eb/No, and presents no error floor phenomenon at a high bit error rate.

In the following, the coding apparatus 1 fulfilled with three conditions as described above will be described in detail.

Figure 18:
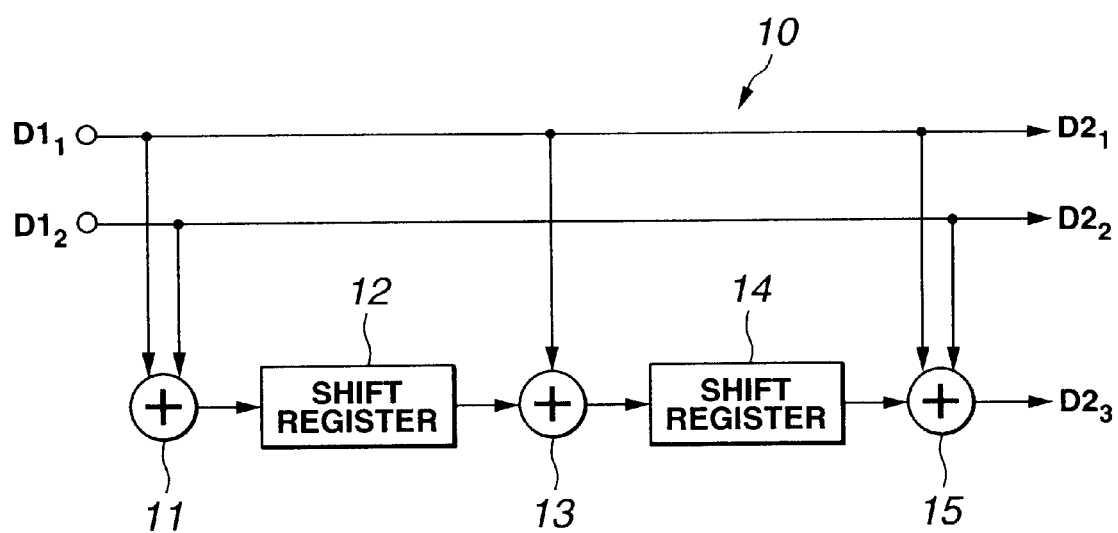
FIG. 18 is a block diagram for explaining the constitution of a convolutional coder for carrying out coding of outer codes provided on the coding apparatus.

It is contemplated that in the coding apparatus 1, the convolutional coder 10 comprises three exclusive OR circuits 11, 13, and 15, and two shift registers 12 and 14, for example, as shown in FIG. 18.

The exclusive OR circuit 11 carries out exclusive OR operation using input data $D1_1$ and $D1_2$ of 2 bits to supply the operation result to the shift register 12.

The shift register 12 continues to supply data of 1 bit being held to the exclusive OR circuit 13. The shift register 12 newly holds data of 1 bit supplied from the exclusive OR circuit 11 by being synchronized with a clock, and newly supplies the data to the exclusive OR circuit 13.

The exclusive OR circuit 13 uses data supplied from the shift register 12 and input data $D_1$ of 1 bit out of input data D1 of 2 bits to carry out exclusive OR operation to supply the operation result to the shift register 14.

The shift register 14 continues to supply data of 1 bit being held to the exclusive OR circuit 15. The shift register 14 newly holds data of 1 bit supplied from the exclusive OR circuit 13 by being synchronized with a clock, and newly supplies the data to the exclusive OR circuit 15.

The exclusive OR circuit 15 uses data supplied from the shift register 14 and input data $D1_1$ and $D1_2$ to carry out exclusive OR operation to output the operation result to the interleaver 20 in the later stage as coded data $D2_3$ of 1 bit out of coded dat D2 of 3 bits.

The convolutional coder 10, when input data $D_1$ and $D1_2$ of 2 bits are input, carries out convolutional operation with respect to the $D_1$ and $D1_2$ to output the operation result to the interleaver 20 in the later stage as coded data $D1_1$, $D1_2$ and $D2_3$ of 3 bits. That is, the convolutional coder 10 carries out convolutional operation whose code rate is "2/3" as coding of an outer code to output coded data D2 to the interleaver 20 in the later stage.

Figure 19:
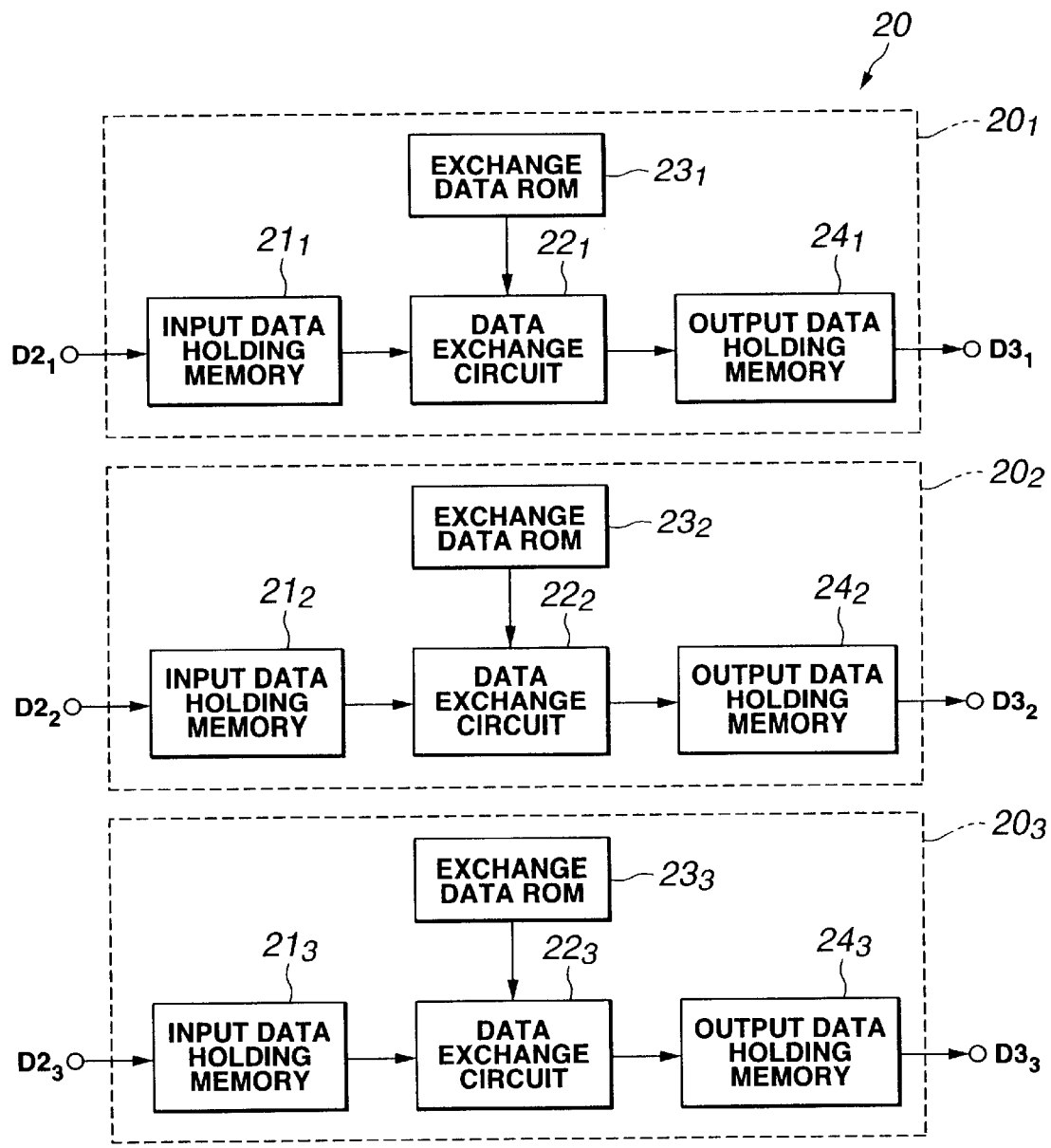
FIG. 19 is a block diagram for explaining the constitution of an interleaver provided on the coding apparatus.

As the interleaver 20, various ones are contemplated to fulfill the aforementioned three conditions, but herein a description is made of the case where the interleave is individually applied to the respective ones of the coded data $D2_1$, $D2_2$ and $D2_3$ of 3 bits, as described above. The interleaver 20 comprises, as shown in FIG. 19, an interleaver $20_1$ for applying interleave to the coded data $D2_1$, an interleaver $20_2$ for applying interleave to the coded data $D2_2$, and an interleaver $20_3$ for applying interleave to the coded data $D2_3$.

The interleaver $20_1$ comprises an input data holding memory $21_1$ for holding data input, a data exchange circuit $22_1$ for carrying out rearrangement (exchange) of data input, an exchange data ROM (Read Only Memory) $23_1$ for storing exchange position information of data, and an output data holding memory $24_1$ for holding data output.

The input data holding memory $21_1$ holds coded data $D2_1$ comprising three bit series output from the convolutional coder 10 to supply the coded data $D2_1$ to the data exchange circuit $22_1$ at a predetermined timing.

The data exchange circuit $22_1$ rearranges order of the coded data $D2_1$ supplied from the input data holding memory $21_1$ on the basis of the exchange position information of data being stored in the exchange data ROM $23_1$. The data exchange circuit $22_1$ supplies the rearranged data to the output data holding memory $24_1$.

The exchange ROM $23_1$ stores exchange position information of data decided, for example, on the basis of random number generated. The interleaver $20_1$ is constituted as a random interleaver for carrying out interleave of data on the basis of the exchange position information. The exchange position information stored in the exchange data ROM $23_1$ is read by the data exchange circuit $22_1$ as occasion calls.

The output data holding memory $24_1$ holds data supplied from the data exchange circuit $22_1$, and outputs these data to the convolutional coder 30 at a predetermined timing as interleave data D3 comprising three bit series.

The interleaver $20_1$ applies interleave to the coded data $D2_1$ output from the convolutional coder 10 to output it to the convolutional coder 30 in the later stage.

More specifically, the input data holding memory $21_1$ sequentially inputs and holds the respective ones of coded data $D2_1$ comprising three bit series output from the convolutional coder 1. The input data holding memory $21_1$ sequentially holds, for example, bits constituting respective ones of coded data $D2_1$ at a predetermined timing, and supplies the data being held to the data exchange circuit $22_1$ at a timing produced by three bit series comprising N bits (N is arbitrary natural number).

Continuously, the data exchange circuit $22_1$ rearranges order of bits of N×3 pieces constituting three bit series supplied from the input holding memory $21_1$ on the basis of exchange information stored in the exchange data ROM $23_1$. The data exchange circuit $22_1$ supplies three new bit series obtained by the rearrangement to the output data holding memory $24_1$.

The output data holding memory $24_1$ holds bits constituting three bit series supplied from the data exchange circuit $22_1$, and outputs the data held to the convolutional coder 30 in the later stage at a predetermined timing, as the interleave data $D3_1$.

As described above, the interleaver $20_1$ inputs the coded data $D2_1$ comprising three bit series output from the convolutional coder 10, and rearrange order of bits constituting the coded data $D2_1$ on the basis of exchange position information pre-stored to produce the interleave data $D3_1$.

The interleaver $20_2$ comprises, similarly to the interleaver $20_1$, an input data holding memory $21_2$, a data exchange circuit $22_2$, an exchange data ROM $23_2$, and an output data holding memory $24_2$; and inputs coded data $D2_2$ output from the convolutional coder 10, and rearranges order of bits constituting the coded data $D2_2$ on the basis of the exchange position information stored in advance to produce interleave data $D3_2$ to output it to the convolutional coder 30.

Further, the interleaver $20_3$ comprises, similarly to the interleaver $20_1$, an input data holding memory $21_3$, a data exchange circuit $22_3$, an exchange data ROM $23_3$, and an output data holding memory $24_3$; and inputs coded data $D2_3$ output from the convolutional coder 10, and rearranges order of bits constituting the coded data $D2_3$ on the basis of the exchange position information stored in advance to produce interleave data $D3_3$ to output it to the convolutional coder 30.

As described above, the interleaver 20 individually applies interleave to the coded data $D2_1$, $D2_2$, $D2_3$ comprising a 3-bit series by three interleavers $20_2$, $20_2$, $20_3$ to produce interleave data $D3_1$, $D3_2$, $D3_3$ comprising a 3-bit series. Preferably, the interleavers $20_1$, $20_2$, $20_3$ carry out interleave with respect to the coded data $D2_1$, $D2_2$, $D2_3$ on the basis of exchange position information different from one another.

Figure 20:
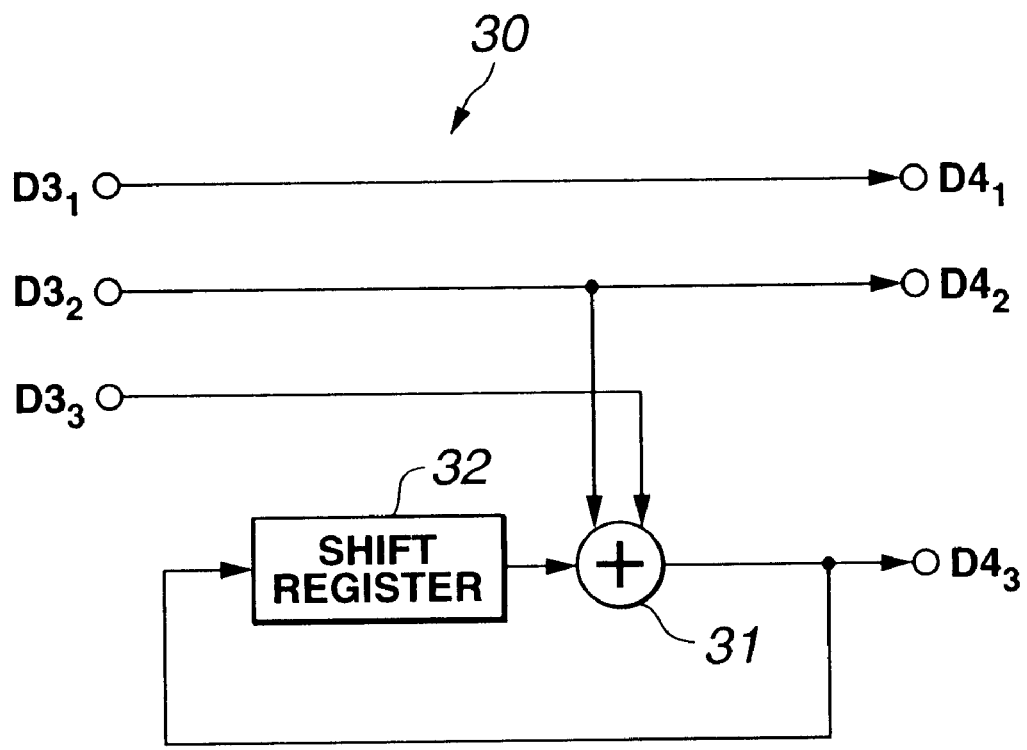
FIG. 20 is a block diagram for explaining the constitution of a convolutional coder for carrying out coding of inner codes provided on the coding apparatus.

It is contemplated that as the convolutional coder 30, one has an exclusive OR circuit 31 and a shift register 32, for example, as shown in FIG. 20.

The exclusive OR circuit 31 carries out exclusive OR operation using interleave data $D3_2$ and $D3_3$ of 2 bits to output the operation result to a multi-value modulation mapping circuit 40 in the later stage as coded data $D4_3$ of 1 bit out of coded data D4 of 3 bits and supply them to the shift register 32.

The shift register 32 continues to supply data of 1 bit being held to the exclusive OR circuit 31. The shift register 32 newly holds data of 1 bit supplied from the exclusive OR circuit 31 by being synchronized with a clock, and newly supplies the data to the exclusive OR circuit 31.

As described above, the convolutional coder 30, when the interleave data $D3_1$, $D3_2$ and $D3_3$ of 3 bits are input, outputs the interleave data $D3_1$ to the interleaver 40 in the later stage as it is without being participated in convolutional operation as coded data $D4_1$, and recursive systematic convolutional operation with respect to $D3_2$ and $D3_3$ to output them to multi-value modulation mapping circuit 40 in the later stage as coded data $D4_2$ and $D4_3$. That is, the convolutional coder 30 uses, in order to fulfill the aforementioned first condition, the interleave data $D3_1$ as the code of the FIR type, and uses other interleave data $D3_2$ and $D3_3$ for the recursive systematic convolution operation. The convolutional coder 30 carries out convolutional operation whose code rate is "3/3=1" as coding of inner code to output coded data D4 to the multi-value modulation mapping circuit 40 in the later stage.

The multi-value modulation mapping circuit 40 causes the code data D4 output from the convolutional coder 30 to synchronize with a clock to apply mapping thereto to a transmission symbol of the 8 PSK modulation system, for example, while fulfilling the aforementioned second condition. That is, the multi-value modulation mapping circuit 40 applies mapping to the coded data D4 of 3 bits output from the convolutional coder 30 as one transmission symbol while fulfilling the aforementioned second condition to produce one coded transmission symbol D5. The multi-value modulation mapping circuit 40 outputs the produced coded transmission symbol D5 to the outside.

The coding apparatus 1 as described carries out convolutional operation whose code rate is "2/3" as coding of outer code by the convolutional coder 10 and carries out convolutional operation whose code rate is "1" as coding of inner code by th convolutional coder 30 to thereby enable carrying out the serially concatenated convolutional operation whose code rate is "(2/3)×1×1=2/3" as a whole. Data coded and modulated by the coding apparatus 1 is output to the receiving apparatus through the memoryless channel 2.

Figure 21:
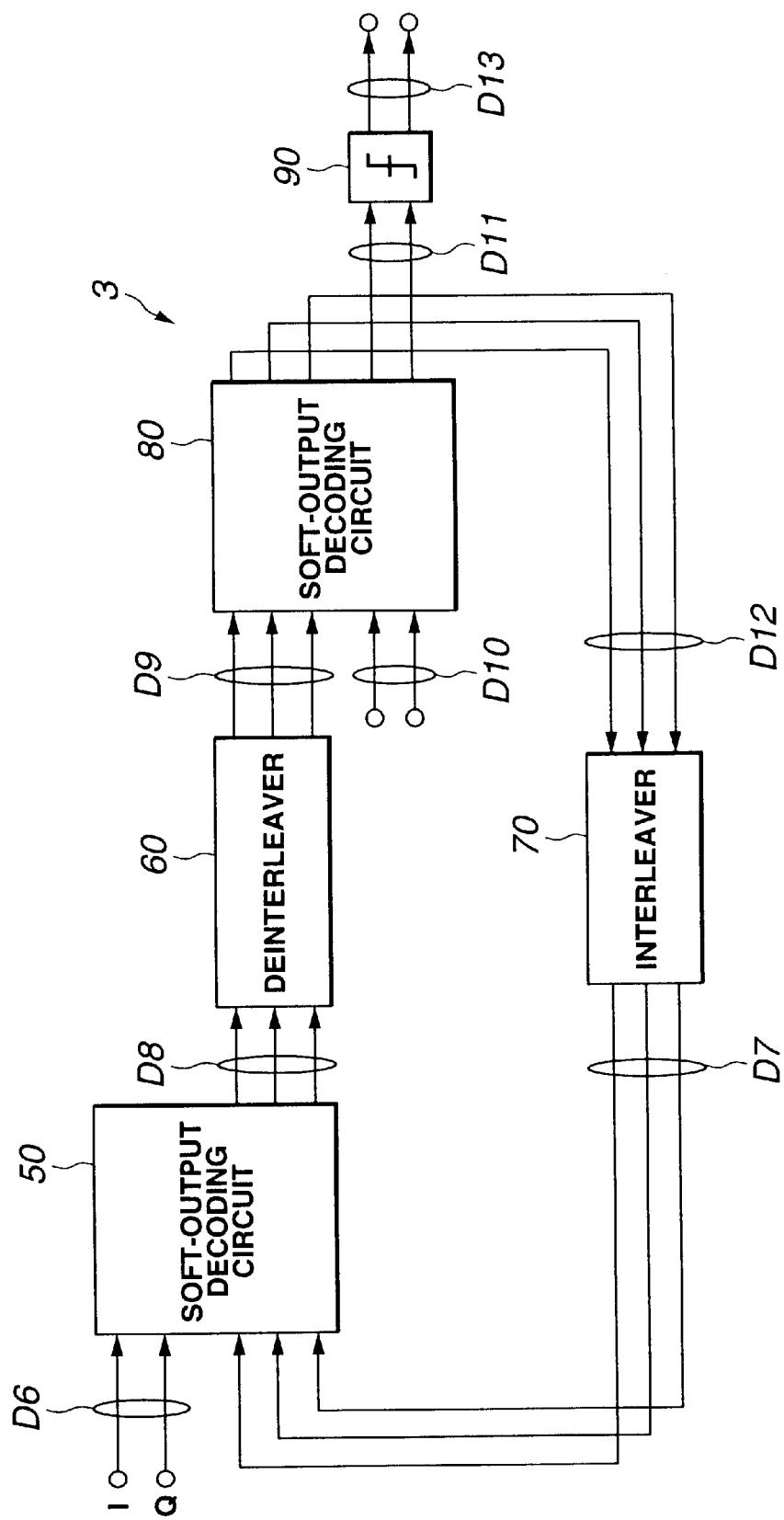
FIG. 21 is a block diagram for explaining the constitution of a decoding apparatus in the data transmit-receive system.

On the other hand, the decoding apparatus 3 comprises, as shown in FIG. 21, two soft-output decoding circuits 50, 80 which are a first soft-output decoding means and a second soft-output decoding means for carrying out soft-output decoding, a deinterleaver 60 which is a reverse interleaving means for returning order of input data to the original state, an interleaver 70 which is a second interleaving means for rearranging order of input data, and a binary circuit 90 which is a binary means for forming input data into a binary. The decoding apparatus 3 presumes input data D1 in the coding apparatus 1 from a reception word D6 which takes an analog value due to the influence of noises generated on the memoryless channel 2 and which is to be a soft-input to output it to as decoded data D13.

Figure 22:
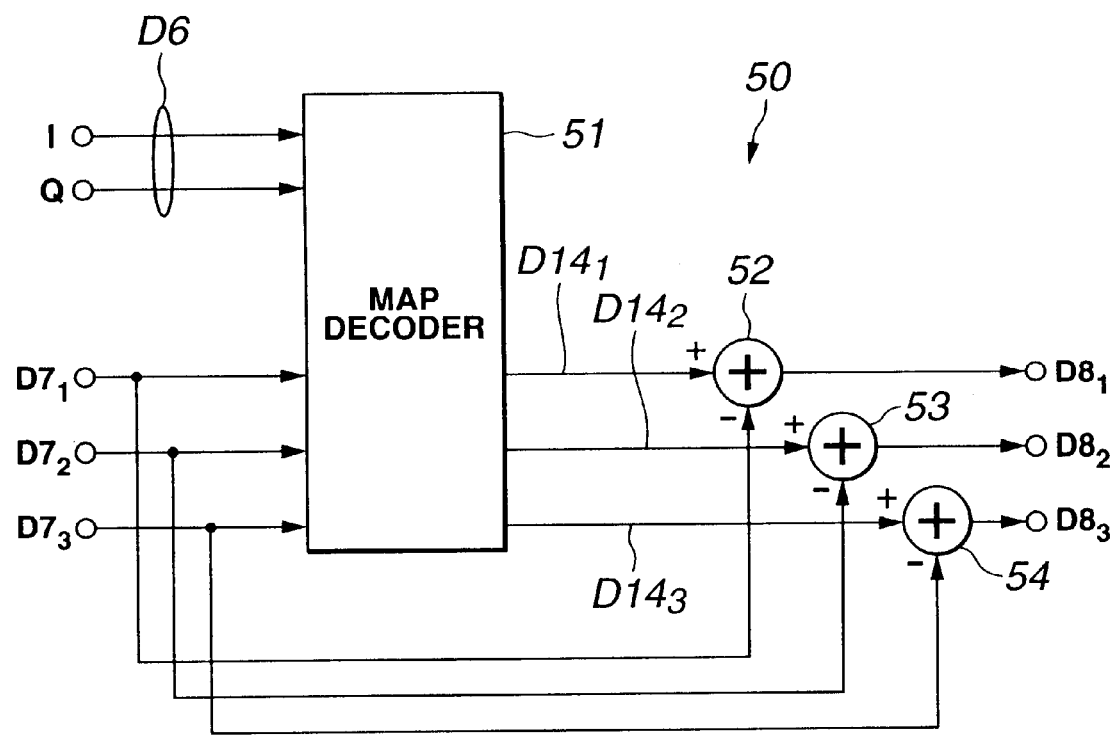
FIG. 22 is a block diagram for explaining the constitution of a soft-output decoding apparatus for carrying out soft-output decoding of inner codes provided on the decoding apparatus.

The soft-output decoding circuit 50 is provided corresponding to the convolutional coder 30 in the coding apparatus 1. The soft-output decoding circuit 50 comprises, as shown in FIG. 22, a MAP decoder 51 for carrying out a maximum a posteriori probability, which is hereinafter referred to as MAP, decoding on the basis of a so-called BCJR (Bahl, Cocke, Jelinek and Raviv) algorithm, and three differentiators 52, 53 and 54.

The MAP decoder 51 inputs a reception word D6 which is a soft-output, and priori probability information $D7_1$, $D7_2$ and $D7_3$ with respect to information bit of 3 bits which are a soft-input supplied from the interleaver 70, and carries out MAP decoding based on the BCJR algorithm to produce posteriori probability information $D14_1$, $D14_2$ and $D14_3$ with respect to information bit of 3 bits on the basis of the reception word D6. The MAP decoder 51 supplies the produced posteriori probability information $D14_1$ to the differentiator 52, supplies the produced posteriori probability information $D14_2$ to the differentiator 53, and supplies the produced posteriori probability information $D14_3$ to the differentiator 54.

The differentiator 52 obtains a differential value between the produced posteriori probability information $D14_1$ and the priori probability information $D7_1$ and outputs the differential value to the deinterleaver 60 as a soft-output, as the extrinsic information $D8_1$ of 1 bit out of the extrinsic information D8 with respect to information bit of 3 bits obtained according to the constraint condition of codes.

The differentiator 53 obtains a differential value between the posteriori probability information $D14_2$ to be a soft-output and the priori probability information $D14_2$, and outputs the differential value to the deinterleaver 60 in the later stage as a soft-output, as the extrinsic information $D14_2$ of 1 bit out of the extrinsic information D8 with respect to information bit of 3 bits.

The differentiator 54 obtains a differential value between the posteriori probability information $D14_3$ to be a soft-output and the priori probability information $D14_3$ and outputs the differential value to the deinterleaver 60 in the later stage as a soft-output, as the extrinsic information $D8_3$ of 1 bit out of the extrinsic information D8 with respect to information bit of 3 bits The soft-output decoding circuit 50 as described above inputs the reception word D6 of a soft-input received by the receiving apparatus, inputs the priori probability information D7 with respect to information bit of a soft-input supplied from the interleaver 70, and carries out MAP decoding based on the BCJR algorithm using these reception word D6 and the priori probability information D7 and carries out soft-output decoding of inner codes. The soft-output decoding circuit 50 produces the extrinsic information D8 obtained according to the constraint condition of codes, and outputs extrinsic information D8 to the deinterleaver 60 in the latter stage as a soft-output.

Specifically explaining, let u be the information bit, c the code bit, and y the reception word D6, then the soft-output decoding circuit 50 causes priori probability information D7 (L(u)) expressed in the following Equation (4) to input into the MAP decoder 51 along with the reception word D6 (y):

$$L(u) = \log\frac{P(u=1)}{P(u=0)} \quad (4)$$

That is, the soft-output decoding circuit 50 causes the reception word D6 (y) and priori probability information D7 (L(u)) free from the constraint condition of codes expressed by the natural logarithm which is the ratio between the probability P(u=1) whose information bit u is "1" and the probability P(u=0) whose information bit u is "0" to input into the MAP decoder 51.

Continuously, the soft-output decoding circuit 50 carries out MAP decoding on the basis of BCJR algorithm by the MAP decoder 51 to produce posteriori probability information D14 (L*(u)) expressed by the following Equation (5):

$$L^*(u) = \log\frac{P(u=1\mid y)}{P(u=0\mid y)} \quad (5)$$

That is, the soft-output decoding circuit 50 produces posteriori probability information D14 (L*(u)) on the basis of the constraint condition of codes expressed by the natural logarithm which is the ratio between the probability P (u=1|y) whose information bit u is "1" when received the reception word D6 (y) and the probability P (u=0|y) whose information bit u is "0" when received the reception word D6 (y). The posteriori probability information D14 (L*(u)) is also called the log likelihood ratio, and here, it shows the likelihood of the information bit u when received the reception word D6 (y).

The soft-output decoding circuit 50 obtains extrinsic information D8 (Le(u)) which is a differential value between the posteriori probability information D14 (L*(u)) and the priori probability D7 (L(u)), as expressed by the following Equation (6) by the differentiators 52, 53 and 54.

$$L_e(u) = L^*(u) - L(u) \quad (6)$$

The soft-output decoding circuit 50 produces the extrinsic information D8 as in the manner as described above, and outputs the extrinsic information D8 to the deinterleaver 60 in the later stage as a soft-output. The extrinsic information D8 corresponds to the interleave data D3 interleaved by the interleaver 20 in the coding apparatus 1.

The deinterleaver 60 applies the interleave to the extrinsic information D8 of a soft-input output from the soft-output decoding circuit 50 so that a bit array of the interleave data D3 interleaved by the interleaver 20 is returned to a bit array of the original coded data D2. The deinterleaver 60 outputs the data obtained by being interleaved as priori probability information D9 with respect to the code bit in the soft-output decoding circuit 80 in the latter stage.

The interleaver 70 applies the interleave based on the same exchange position information as the interleaver 20 in the coding apparatus 1 to the extrinsic information D12 with respect to the code bit which is a soft-output from the soft-output decoding circuit 80. The interleaver 70 outputs the data obtained by being interleaved as the priori probability information D7 with respect to the signal bit in the soft-output decoding circuit 50.

Figure 23:
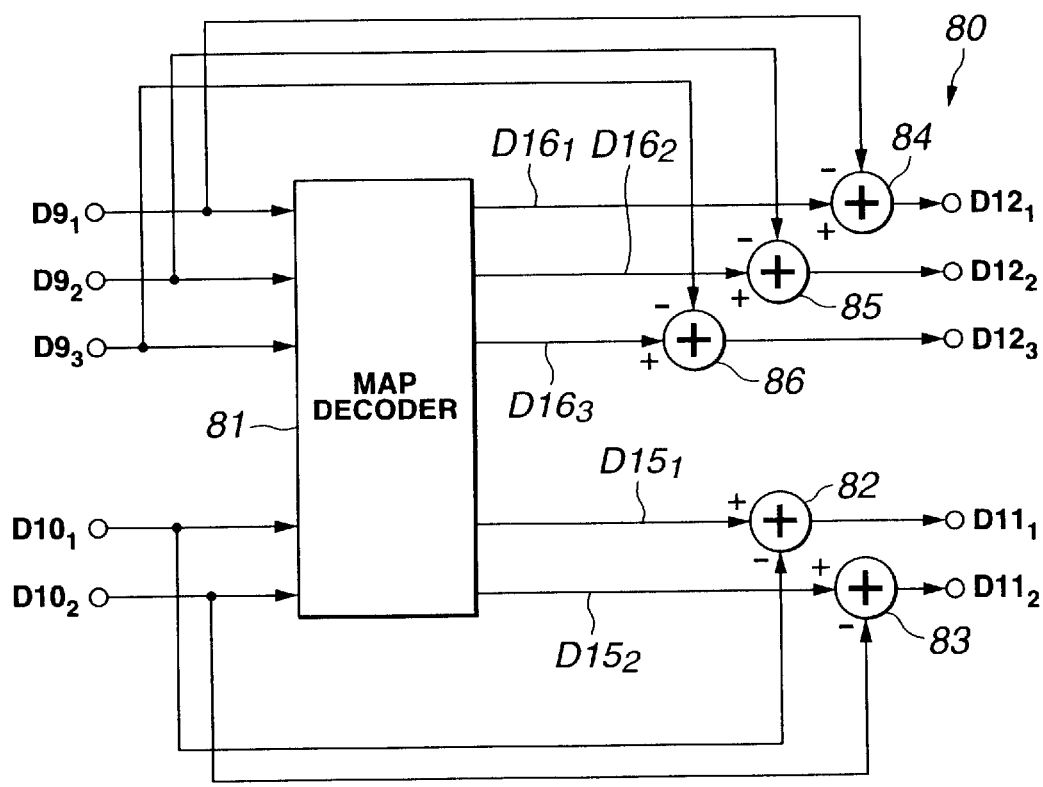
FIG. 23 is a block diagram for explaining the constitution of a soft-output decoding circuit for carrying out soft-output decoding of outer codes provided on the decoding apparatus.

The soft-output decoding circuit 80 is provided corresponding to the convolutional decoder 10 in the coding apparatus 1. The soft-output decoding circuit 80 comprises, as shown in FIG. 23, a MAP decoder 81 for carrying out MAP decoding based on the BCJR algorithm described above, and five differentiators 82, 83, 84, 85, and 86.

The MAP decoder 81 inputs priori probability information $D9_1$, $D9_2$ and $D9_3$ with respect to the code bit of 3 bits which is a soft-output from the deinterleaver 60, and priori probability information $D10_1$, $D10_2$ with respect to the code bit of 2 bits whose value is "0" and carries out MAP decoding based on the BCJR algorithm to produce posteriori probability information $D15_1$, $D15_2$ with respect to the information bit of 2 bits and produce posteriori probability information $D16_1$, $D16_2$ and $D16_3$ with respect to the code bit of 3 bits. The MAP 81 supplies the produced posteriori probability information $D15_1$ to the differentiator 82, and supplies the produced posteriori probability information $D15_2$ to the differentiator 83. The MAP decoder 81 further supplies the produced posteriori probability information $D16_1$ to the differentiator 84, supplies the produced posteriori probability information $D16_2$ to the differentiator 85, and supplies the produced posteriori probability information $D16_3$ to the differentiator 86.

The differentiator 82 outputs a differential value between the posteriori probability information $D15_1$ to be a soft-input and the priori probability information $D10_1$ whose value is "0", that is, posteriori probability information $D15_1$ to the binary circuit 90 in the later stage as a soft-output, as the extrinsic information $D11_1$ of 1 bit out of the extrinsic information D11 with respect to the information bit of 2 bits according to the constraint condition of codes.

The differentiator 83 outputs a differential value between the posteriori probability information $D15_2$ to be a soft-input and the priori probability information $D10_2$ whose value is "0", that is, posteriori probability information $D15_2$ to the binary circuit 90 in the later stage as a soft-output, as the extrinsic information $D11_2$ of 1 bit out of the extrinsic information D11 with respect to the information bit of 2 bits according to the constraint condition of codes.

The differentiator 84 obtains a differential value between the posteriori probability information $D16_1$ to be a soft-input and the priori probability information $D9_1$ to be a soft-input to output the differential value to the interleaver 70 as a soft-output, as the extrinsic information $D12_1$ of 1 bit out of the extrinsic information D12 with respect to code bit of 3 bits.

The differentiator 85 obtains a differential value between the posteriori probability information $D16_2$ to be a soft-input and the priori probability information $D9_2$ to be a soft-input to output the differential value to the interleaver 70 as a soft-output, as the extrinsic information $D12_2$ of 1 bit out of the extrinsic information D12 with respect to code bit of 3 bits.

The differentiator 86 obtains a differential value between the posteriori probability information D163 to be a soft-input and the priori probability information $D9_3$ to be a soft-input to output the differential value to the interleaver 70 as a soft-output, as the extrinsic information $D12_3$ of 1 bit out of the extrinsic information D12 with respect to code bit of 3 bits.

The soft-output decoding circuit 80 as described above inputs the priori probability information D9 with respect to the code bit of a soft-input output from the deinterleaver 60, and inputs the priori probability information D10 with respect to the information bit whose value is "0", and uses these priori probability information D9, D10 to carry out MAP decoding based on the BCJR algorithm and carry out soft-output decoding of outer codes. The soft-output decoding circuit 80 produces the extrinsic information D11 and D12 obtained according to the constraint condition of codes, and outputs the extrinsic information D11 to the binary circuit 90 in the later stage as a soft-output, and outputs the extrinsic information D12 to the interleaver 70 as a soft-output.

Specifically explaining, let u be the information bit and c the code bit, then the soft-output decoding circuit 80 causes priori probability information D10 (L(u)) expressed in the following Equation (7) and priori probability information D9 (L(c)) expressed in the following Equation (8) to input into the MAP decoder 81:

$$L(u) = \log \frac{P(u=1)}{P(u=0)} \tag{7}$$

$$L(c) = \log \frac{P(c=1)}{P(c=0)} \tag{8}$$

That is, the soft-output decoding circuit 80 causes the priori probability information D10 (L(u)) on the basis of the constraint condition of codes expressed by the natural logarithm which is the ratio between the probability P(u=1) whose information bit u is "1" and the probability P (u=0) whose information bit u is "0", and the priori probability information D9 (L(c)) on the basis of the constraint condition of codes expressed by the natural logarithm which is the ratio between the probability P(c=1) whose code bit c is "1" and the probability P(c=0) whose code bit c is "0" to input into the MAP decoder 81. It is noted that the constraint conditions of codes to be described on the right side of the Equations (7) and (8) are omitted here. Further, it is noted here that priori probability information D10 (L(u)) is "0" because the probability whether the information bit u is "0" or "1" is 1/2.

Continuously, the soft-output decoding circuit 80 carries out MAP decoding on the basis of BCJR algorithm by the MAP decoder 81 to produce posteriori probability information D15 (L*(u)) expressed by the following Equation (9) and posteriori probability information D16 (L*(c)) expressed by the following Equation (10):

$$L^*(u) = \log \frac{P(u=1)}{P(u=0)} \tag{9}$$

$$L^*(c) = \log \frac{P(c=1)}{P(c=0)} \tag{10}$$

That is, the soft-output decoding circuit 80 produces posteriori probability information D15 (L*(u)) on the basis of the constraint condition of codes expressed by the natural logarithm which is the ratio between the probability P (u=1) whose information bit u is "1" and the posteriori probability P (u=0) whose information bit u is "0", and posteriori probability information D16 (L*(c)) on the basis of the constraint condition of codes expressed by the natural logarithm which is the ratio between the probability P (c=1) whose code bit c is "1" and the posteriori probability P (c=0) whose code bit c is "0". It is noted that the constraint conditions of codes to be described on the right side of the Equations (9) and 107) are omitted here. The posteriori probability information D15 (L*(u)) and the posteriori probability information D16 (L*(c)) are also called the log likelihood ratio, and here, it shows the likelihood of the information bit u and the likelihood of the code bit c.

The soft-output decoding circuit 80 obtains extrinsic information D11 (Le(u)) which is a differential value between the posteriori probability information D15 (L*(u)) and the priori probability D10 (L(u)), as expressed by the following Equation (11) by the differentiators 82, 83; and obtains extrinsic information D12 (Le(c)) which is a differential value between the posteriori probability information D16 (L*(c)) and the priori probability D9 (L(c)), as expressed by the following Equation (12) by the differentiators 84, 85 and 86.

$$L_e(u) = L^*(u) - L(u) \tag{11}$$

$$L_e(c) = L^*(c) - L(c) \tag{12}$$

The soft-output decoding circuit 80 produces the extrinsic information D11 and D12 in the manner as described above, outputs the extrinsic information D11 to the binary circuit 90 in the later stage as a soft-output and outputs the extrinsic information D12 to the interleaver 70 as a soft-output.

It is noted that the soft-output decoding circuit 80 need not always be provided with the differentiators 82 and 83 since the priori probability information D10 with respect to the information bit is "0".

The binary circuit 90 forms the extrinsic information D11 supplied from the soft output decoding circuit 80 into a binary on the basis of the extrinsic information D11 of soft-output produced by the soft-output decoding circuit 80, that is, the posteriori probability information D15 to output it to the decoded data D13 of hard-output.

The decoding apparatus 3 as described is provided with the soft-output decoding circuits 50, 80 corresponding to the convolutional coders 30, 10, respectively, in the coding apparatus 1, whereby codes with high decoding complicatedness can be decomposed into small elements, and the characteristics can be successively enhanced by the mutual action between the soft-output decoding circuits 50, 80. The decoding apparatus 3, when the reception word D6 is input, carries out decoding operation of the soft-output decoding circuit 50 to the soft-output decoding circuit 80 iteratively by the predetermined number of times, for example, such as several to scores of times to output decoded data D13 on the basis of the extrinsic information D11 of soft-output obtained as a result of the predetermined number of times of decoding operation, that is, the posteriori probability information D15.

Figure 1:
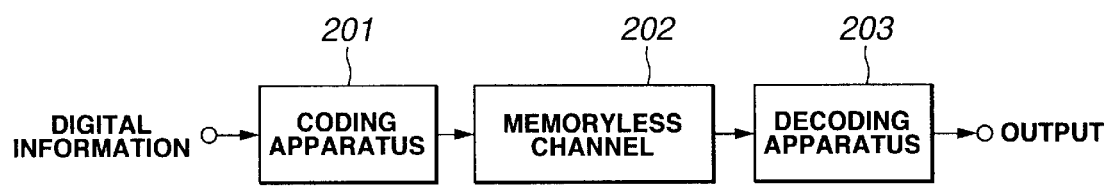
FIG. 1 is a block diagram for explaining the constitution of a communication model.
Figure 2:
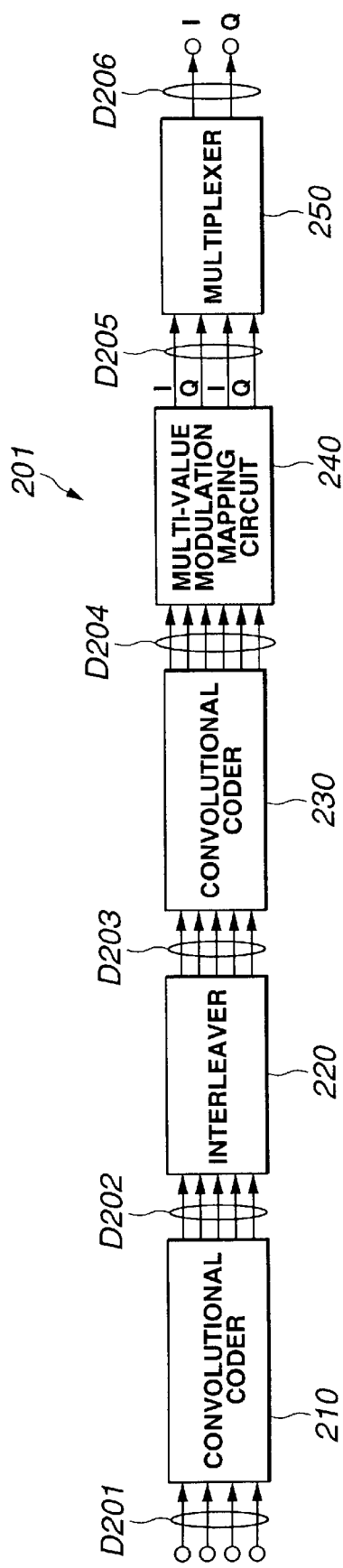
FIG. 2 is a block diagram for explaining the constitution of a conventional coding apparatus.
Figure 3:
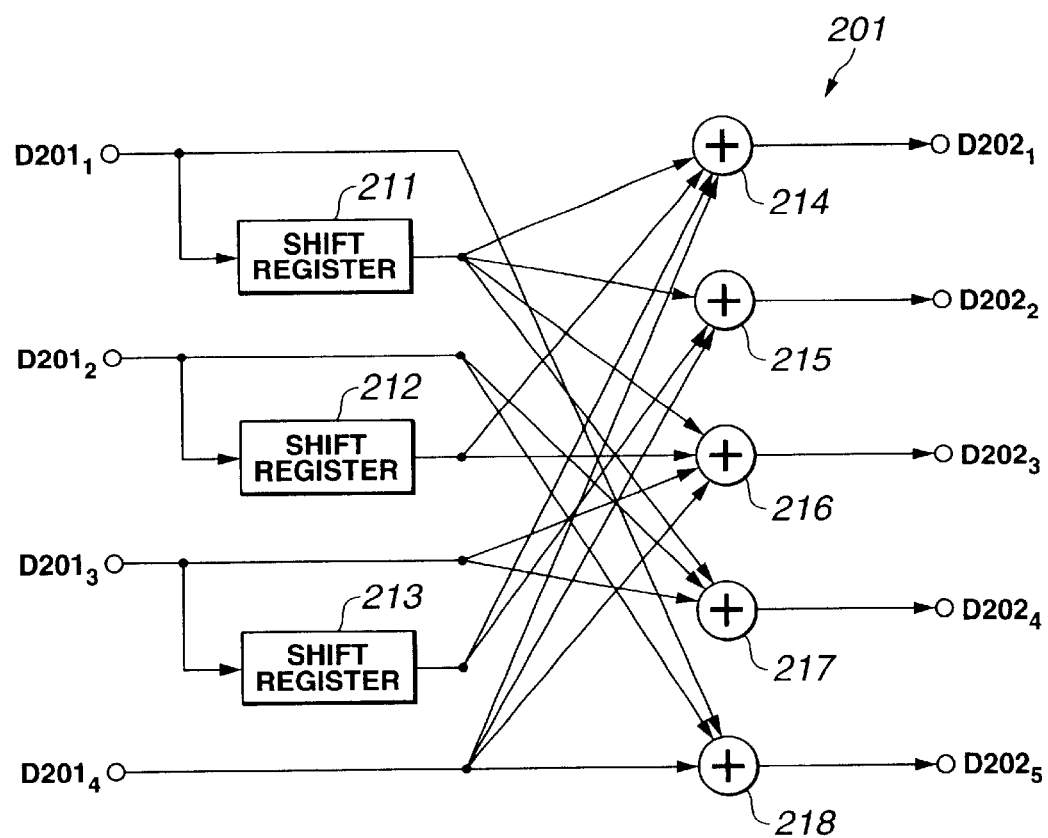
FIG. 3 is a block diagram for explaining the constitution of a convolutional coder for carrying out coding of outer codes provided on the coding apparatus shown in FIG. 2.
Figure 4:
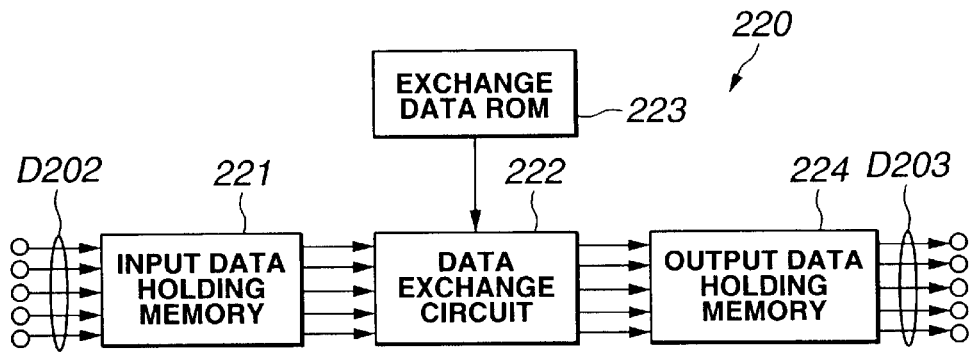
FIG. 4 is a block diagram for explaining the constitution of an interleaver provided on the coding apparatus sown in FIG. 2.
Figure 5:
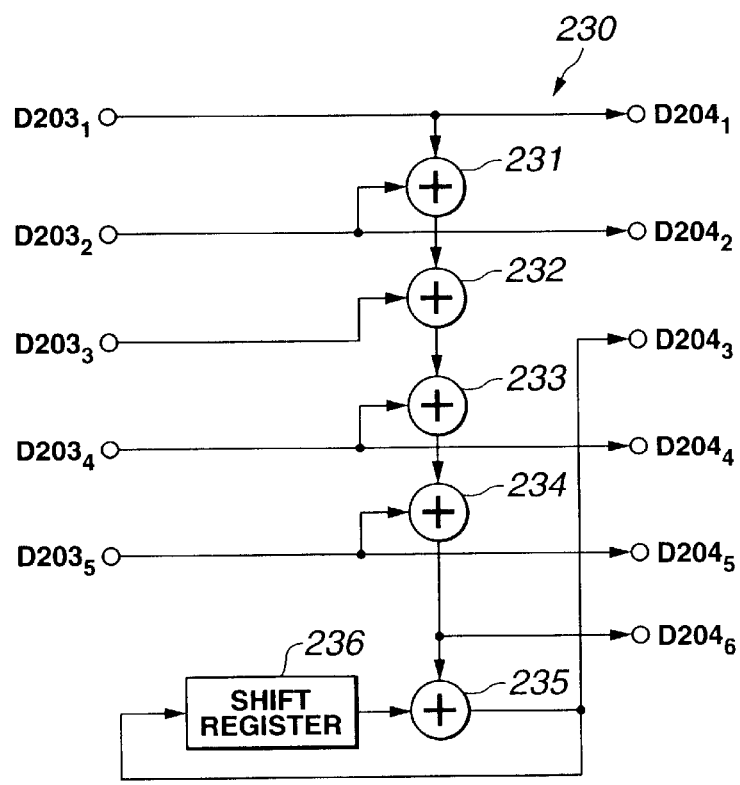
FIG. 5 is a block diagram for explaining the constitution of a convolutional coder for carrying out coding of internal cods provided on the coding apparatus shown in FIG. 2.
Figure 6:
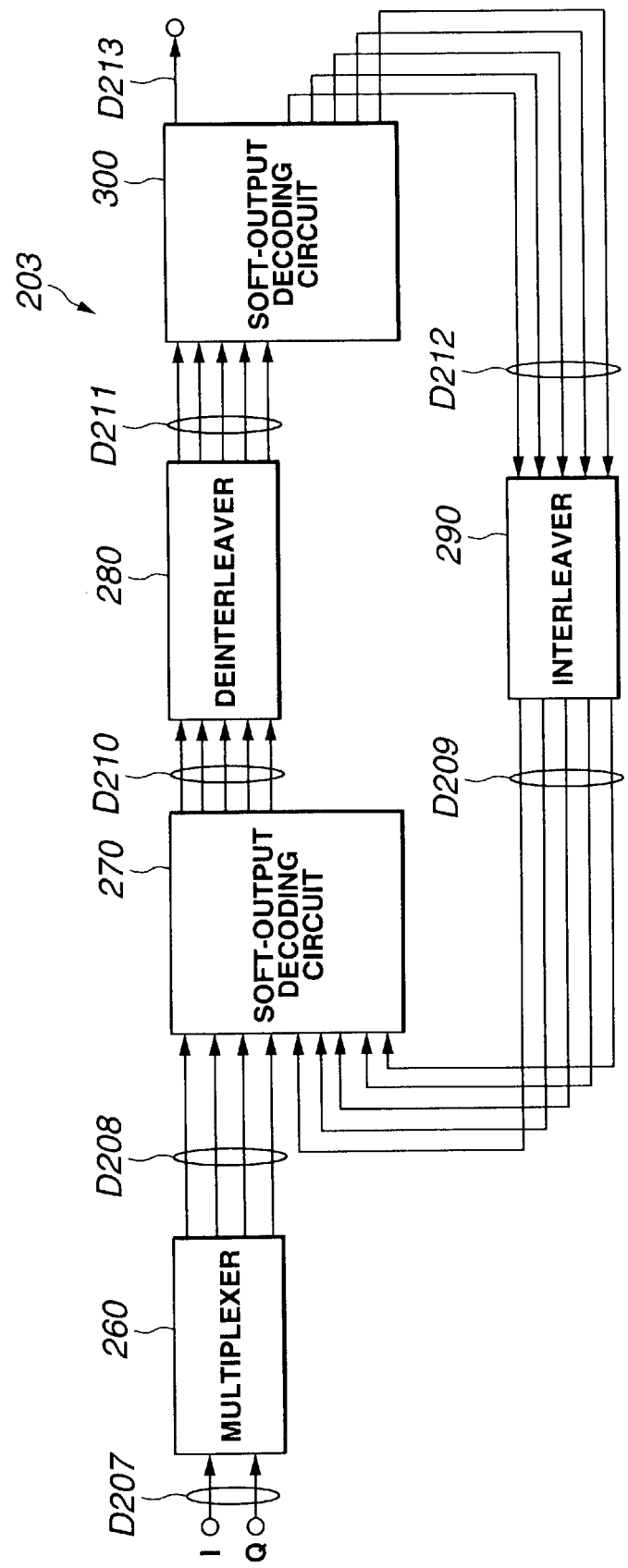
FIG. 6 is a block diagram for explaining the constitution of a conventional decoding apparatus.
Figure 7:
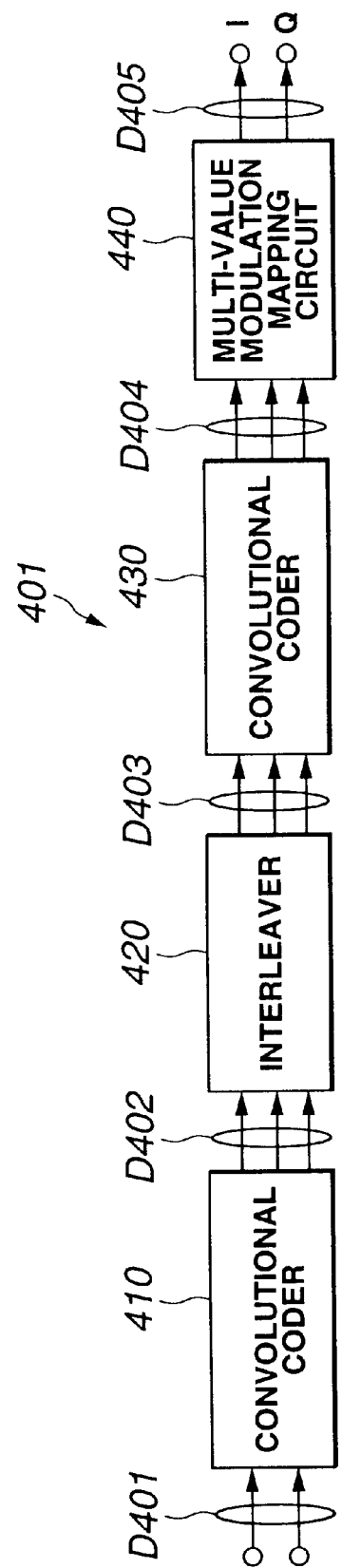
FIG. 7 is a block diagram for explaining a further constitution of the conventional coding apparatus.
Figure 8:
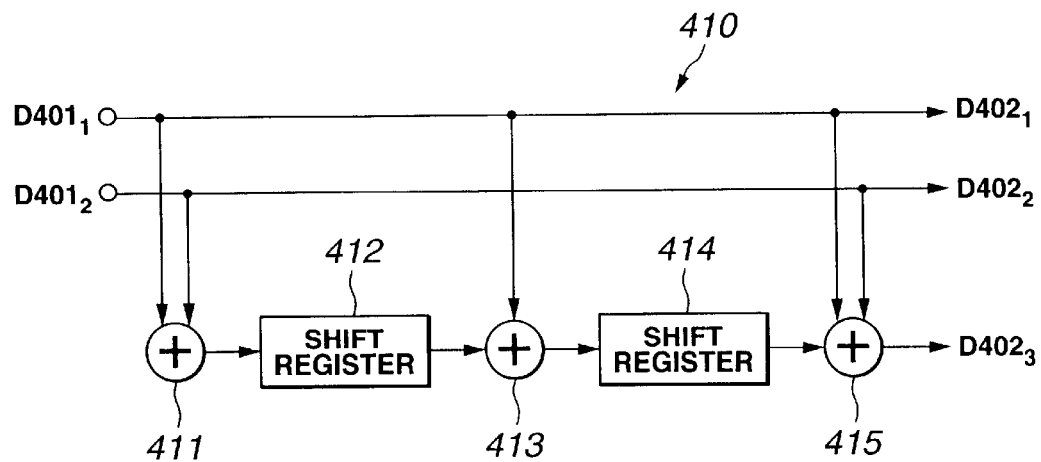
FIG. 8 is a block diagram for explaining the constitution of a convolutional coder for carrying out coding of outer codes provided on the coding apparatus shown in FIG. 7.
Figure 9:
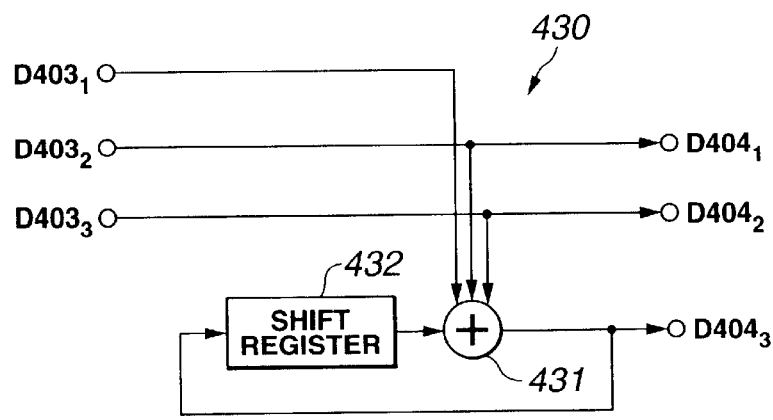
FIG. 9 is a block diagram for explaining the constitution of a convolutional coder for carrying out coding of inner code provided on the coding apparatus shown in FIG. 7.
Figure 10:
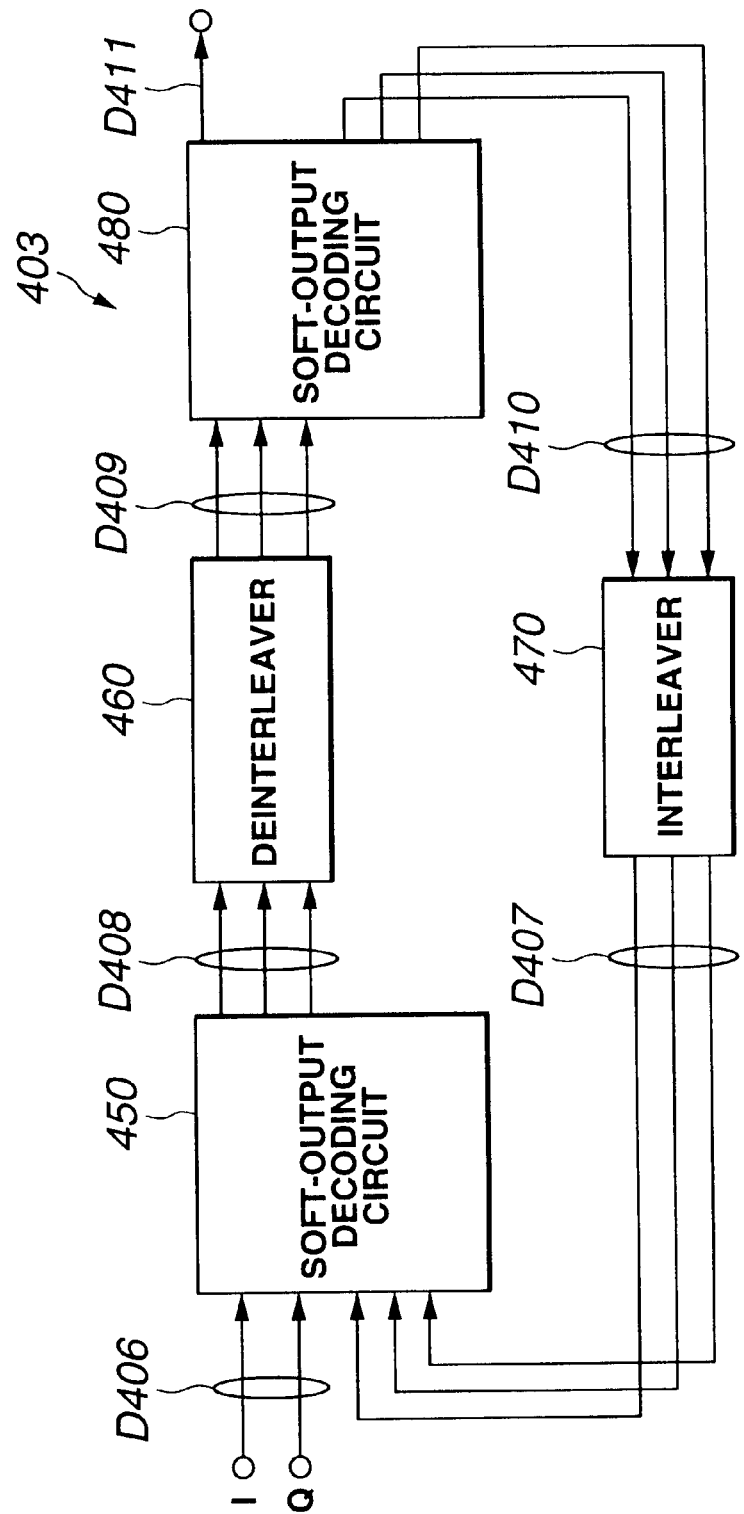
FIG. 10 is a block diagram for explaining the constitution of a conventional decoding apparatus.
Figure 11:
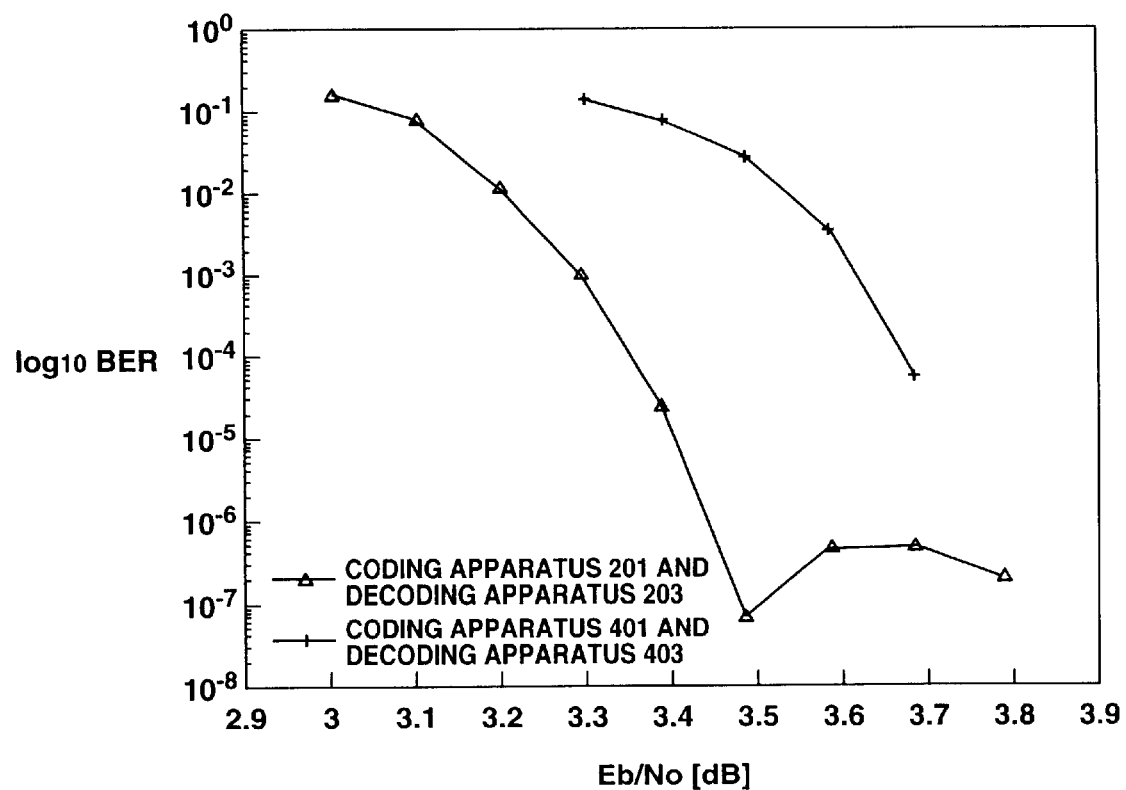
FIG. 11 is a block diagram for explaining the performance curve in the conventional system composed of the coding apparatus shown in FIG. 2 and the decoding apparatus shown in FIG. 6, and the performance curve in the conventional system composed of the coding apparatus shown in FIG. 7 and the decoding apparatus shown in FIG. 10.
Figure 12:
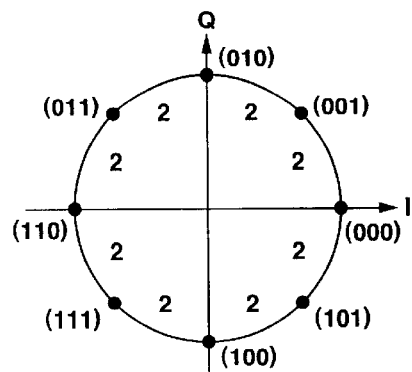
FIG. 12 is a view for explaining the signal point arrangement based on the 8PSK modulation system, showing the case where the input distance sum of the minimum Euclidean distance is "16".
Figure 24:
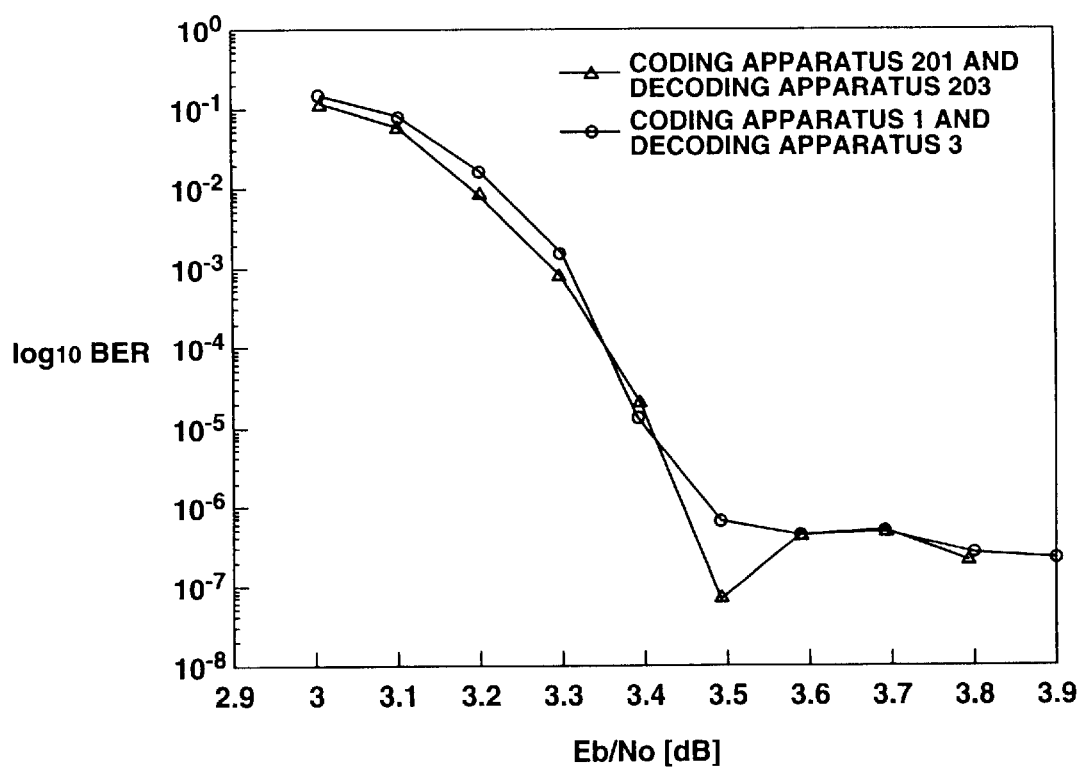
FIG. 24 is a view for explaining the performance curve in the data transmit-receive system and the performance curve in the conventional system.
Figure 25:
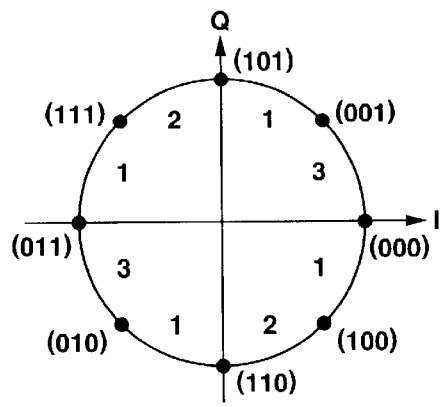
FIG. 25 is a view for explaining the signal point arrangement based on the 8 PSK modulation system, showing the case where the input distance sum of the minimum Euclidean distance is "14".

The performance curve in the data transmit-receive system composed of the coding apparatus 1 and the decoding apparatus 3 described above is obtained, for example, as shown in FIG. 24. FIG. 24 shows the performance curve in the case where as coding of outer code by the convolutional coder 10, coding given by a generator matrix $G_O$ shown in the following formula (13) is carried out; as coding of inner code by the convolutional coder 30, coding given by a generator matrix $G_I$ shown in the following formula (14) is carried out; and as mapping of a signal point by the multi-value modulation mapping circuit 40, mapping of a signal point is carried out with the input distance sum of the minimum Euclidean distance set to "14" as shown in FIG. 25. FIG. 24 also shows, for the purpose of comparison, the performance curve in the conventional system composed of the coding apparatus 201 and the decoding apparatus 203 previously shown in FIG. 11.

$$G_O = \begin{bmatrix} 1 & D & 1+D \\ D+D^2 & 1 & 1+D^2 \end{bmatrix} \tag{13}$$

$$G_I = \begin{bmatrix} 1 & 0 & 0 \\ 0 & 1 & D/(1+D+D^2) \\ 0 & 0 & 1/(1+D+D^2) \end{bmatrix} \tag{14}$$

It is understood, as apparent from FIG. 24, that the data transmit-receive system composed of the coding apparatus 1 and the decoding apparatus 3 has substantially the same high performance as that of the conventional system composed of the coding apparatus 201 and the decoding apparatus 203. It is noted that if the size of the interleaver 20 is made to be large, the inclination in the water fall region can be made to be large in the performance curve.

Further, in the data transmit-receive system composed of the coding apparatus 1 and the decoding apparatus 3, in the coding apparatus 1, the convolutional coders 10, 30 are serially concatenated, and the convolutional operation whose code rate is "k/(k+1)" (k is the arbitrary natural number more than 2) is carried out as coding of outer code while fulfilling the aforementioned conditions 1 to 3, after which as coding of inner code, the convolutional operation whose code rate is "1" is carried out whereby the whole code rate can be maintained at a high value of "k/(k+1)" with the simple constitution. And, in the decoding apparatus 3, the soft-output decoding circuits 50, 80 corresponding to the convolutional coders 30, 10 in the coding apparatus 1 are serially concatenate whereby the decoding with high accuracy can be carried out with the simple constitution.

Accordingly, the data transmit-receive system composed of the coding apparatus 1 and the decoding apparatus 3 is able to exhibit the high performance despite the simple constitution with a small circuit scale as compared with the conventional system composed of the coding apparatus 201 and the decoding apparatus 203.

As described above, the data transmit-receive system according to the embodiment of the present invention is possible to realize coding and decoding by the SCTCM system with high performance under the small circuit scale and high code rate, providing high conveniences and reliability for a user.

It is noted that the present invention is not limited to the aforementioned embodiment. For example, while in the above-described embodiment, the interleaver 20 in the coding apparatus 1 has the interleavers $20_1$, $20_2$, $20_3$ corresponding to the coded data $D2_1$, $D2_2$, $D2_3$ to be input, respectively, it is noted that the interleaver 20 may not have the interleaver $20_1$. That is, the constitution can be employed in which as the interleaver 20, a delay unit (not shown) for delaying the coded data $D2_1$ by the same time as the processing time required by the interleavers $20_2$, $20_2$ is provided in place of the interleaver $20_1$, and the interleave is not applied to the coded data $D2_1$.

Figure 26:
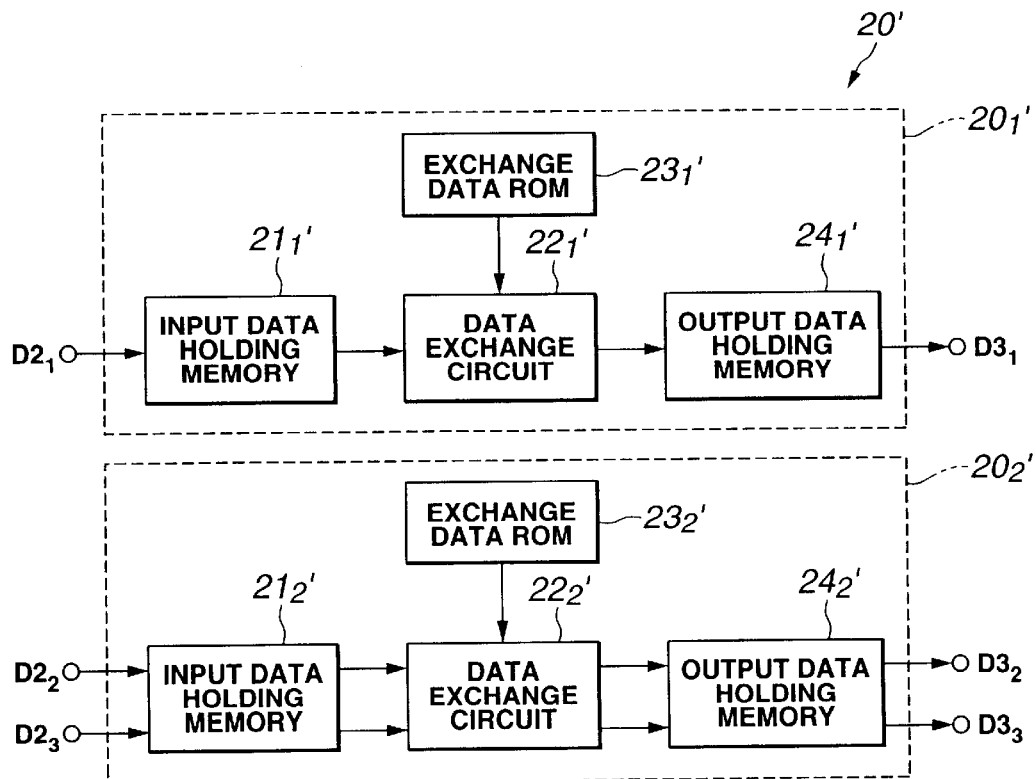
FIG. 26 is a block diagram for explaining a further constitution of an interleaver provided on the coding apparatus.

Further, as the interleave 20, one as shown in FIG. 26 may be used.

That is, an interleaver 20' shown in the figure comprises an interleaver $20_1$' for applying interleave to a coded data $D2_1$, and an interleaver $20_2$' for applying interleave to coded data $D2_2$, $D2_3$.

The interleaver $20_1$' comprises, similarly to the aforementioned interleaver $20_1$, an input data holding memory $21_1$', a data exchange circuit $22_1$', an exchange data ROM $23_1$', and an output data holding memory $24_1$', and inputs coded data $D2_1$ from the convolutional coder 10, and rearranges order of bits constituting the coded data $D2_1$ on the basis of the exchange position information stored in advance to produce an interleave data $D3_1$ to output it to the convolutional coder 30.

The interleaver $20_2$' comprises, similarly to the aforementioned interleaver $20_1$, an input data holding memory $21_2$', a data exchange circuit $22_2$', an exchange data ROM $23_2$', and an output data holding memory $24_2$', and inputs coded data $D2_2$, $D2_3$ from the convolutional coder 10, and rearranges order of bits constituting the coded data $D2_2$, $D2_3$ on the basis of the exchange position information stored in advance to produce interleave data $D3_2$, $D3_3$ to output them to the convolutional coder 30.

That is, in the interleaver 20', coded data $D2_1$, and coded data $D2_2$, $D2_3$ out of coded data $D2_1$, $D2_2$, $D2_3$ comprising 3 bit series are individually interleaved by two interleavers $20_1$', $20_2$' whereby all weights of outer code cannot be input as code of FIR type in the convolutional coder 30.

Figure 27:
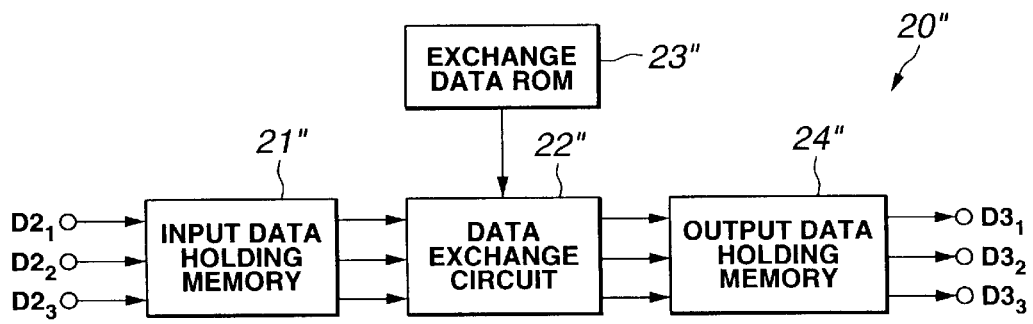
FIG. 27 is a block diagram for explaining still another constitution of an interleaver provided on the coding apparatus.

Further, the interleaver 20 carries out the interleave based on the exchange position information in accordance with the rules shown below whereby three interleavers $20_1$, $20_2$, $20_3$ need not be used, and two interleavers $20_1$', $20_2$' need not be used, but for example, it can be constituted by a single interleaver comprising the constitution similar to the interleaver $20_1$. That is, an interleaver 20" shown in FIG. 27 comprises, similar to the interleaver interleaver $20_1$, an input data holding memory 21", a data exchange circuit 22", an exchange data ROM 23", and an output data holding memory 24".

Figure 28:
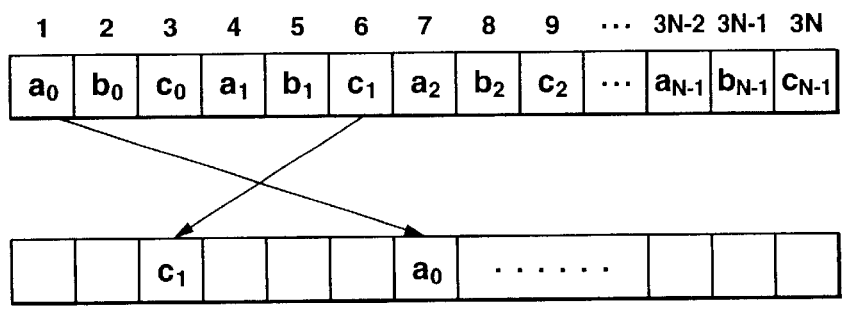
FIG. 28 is a block diagram for explaining operation of the interleaver shown in FIG. 27, showing the arrangement of bits before and after exchange.

It is here supposed that let $a_0, b_1, c_2 \ldots$ be the bit series of coded data $D2_1$ output from the convolutional coder 10, let $b_0, b_1, b_2 \ldots$ be the bit series of coded data $D2_2$, and let $c_0, c_1, c_2 \ldots$ be the bit series of coded data $D2_3$, and the bit series of N×3 bits priori to exchange supplied to th data exchange circuit 22" is arranged at primary position numbers given by order as shown in the upper stage in FIG. 28.

At this time, the interleaver 20" rearranges, on the basis of the exchange position information stored in the exchange position data ROM 23, elements in the bit series of N×3 bits so that a remainder obtained by dividing the position number before exchange using, as a divisor, "3" which is the number of data as the coded data output from the convolutional coder 10 is equal to a remainder obtained by dividing the position number after exchange using, as a divisor, "3".

Concretely, $a_n$ which is an element of the coded data $D2_1$ is arranged at a position in which a remainder obtained by dividing using "3" as a divisor is "1" such as 1, 4, 7, ..., 3N–2 before exchange; $b_n$ which is an element of the coded data $D2_2$ is arranged at a position in which a remainder obtained by dividing using "3" as a divisor is "2" such as 2, 5, 8, ..., 3N–1 before exchange; and $c_n$ which is an element of the coded data $D2_3$ is arranged at a position in which a remainder obtained by dividing using "3" as a divisor is "0" such as 3, 6, 9, ..., 3N before exchange. Accordingly, the interleaver 20" rearranges, as shown in the lower stage in the figure, $a_n$ which is an element of the coded data $D2_1$ to the position number in which a remainder obtained by dividing using "3" as a divisor is "1" such as 1, 4, 7, ..., 3N–2; rearranges $b_n$ which is an element of the coded data $D2_2$ to the position number in which a remainder obtained by dividing using "3" as a divisor is "2" such as 2, 5, 8, ..., 3N–1; and rearranges $c_n$ which is an element of the coded data $D2_3$ to the position number in which a remainder obtained by dividing using "3" as a divisor is "0" such as 3, 6, 9, ..., 3N. Further, in other words, the interleaver 20", with respect to a arbitrary integer n more than 0 and less than N, exchanges $a_n$ which is an element of the coded data $D2_1$ to the position number 3n+1; exchanges $b_n$ which is an element of the coded data $D2_2$ to the position number 3n+2; and exchanges $c_n$ which is an element of the coded data $D2_3$ to the position number 3n+3.

The interleaver 20" is able to carry out interleave on the basis of the exchange position information according to the rule as described.

It is noted that the interleaver 20" may carry out interleave on the basis of conception of so-called "S-random" exchange. That is, in the interleaver 20", where the position number of the exchange destination of the past S bit is present within + or –S when a bit of the destination is assigned to a certain bit on the basis of the above-described rule, the bit of destination is reassigned to the bit so as to secure the distance between input bits. At that time, the interleaver 20" may carry out interleave based on the conception of the "S-random" exchange with respect to only the coded data $D2_2$, $D2_3$ corresponding to the interleave data $D2_2$, $D2_3$.

Furthermore, while in the above-described embodiment, a description has been made of the case where the number of shift registers in the convolutional coder 10 is two, it is noted that the number of shift registers may be 3 or 4 or 1. It is noted that the convolutional coder 10 has the possibility capable of producing codes with low error floor by creasing the number of shift registers.

Further, while in the above-described embodiment, a description has been made of the case where the number of shift registers in the convolutional coder 30 is 1, it is noted of course that also in this case, the number of shift registers may be 2, for example.

Further, with respect to the arrangement of signal points, various arrangement may be applied according to a combination with inner codes, in addition to those shown in the embodiments described above.

Figure 29:
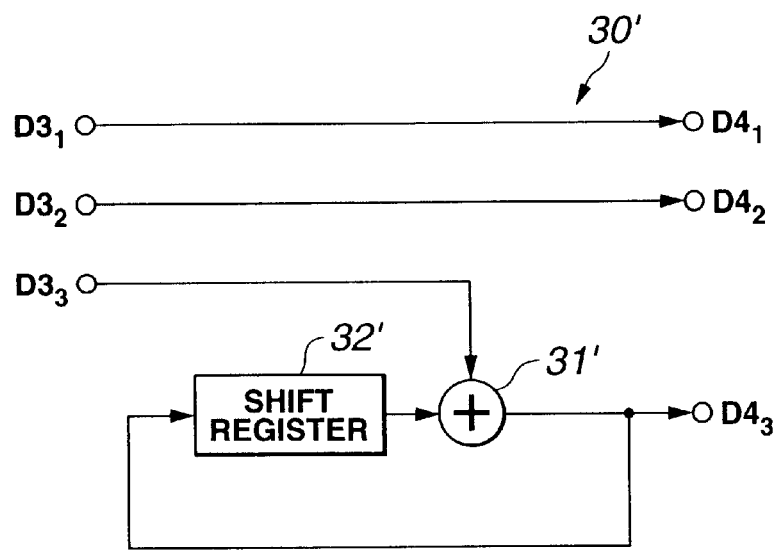
FIG. 29 is a block diagram for explaining another constitution of a convolutional coder for carrying out coding of inner codes provided on the coding apparatus.
Figure 30:
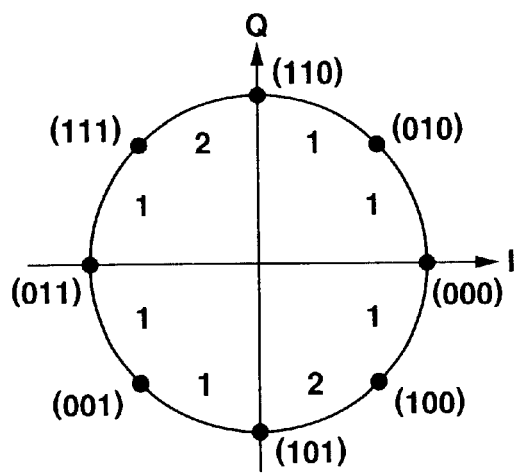
FIG. 30 is a view for explaining the signal point arrangement based on the 8 PSK modulation system, showing the case where the input distance sum of the minimum Euclidean distance is "10".

For Example, where as coding of inner code, coding given by the generator matrix $G_I$ shown in the following formula (15), that is, coding of inner code is carried out by a convolutional coder 30' shown in FIG. 29, and mapping of a signal point is shown in FIG. 30 by a multi-value modulation mapping circuit 40.

$$G_I = \begin{bmatrix} 1 & 0 & 0 \\ 0 & 1 & 0 \\ 0 & 0 & 1/(1+D) \end{bmatrix} \quad (15)$$

The convolutional coder 30' comprises, as shown in FIG. 29, an exclusive OR shift register 32'.

The convolutional coder 30' as described outputs, when interleave data $D3_1$, $D3_2$, $D3_3$ of 3 bits are input, the interleave data $D3_1$, $D3_2$ to the multi-value modulation mapping circuit 40 in the later stag as coded data $D4_1$, $D4_2$ as it is without being participated in convolutional operation, and carries out recursivesystematic convolutional operation with respect to the interleave data $D3_3$ to output the operation result to the multi-value modulation mapping circuit 40 in the later stage. That is, the convolutional coder 30' uses, in order to fulfill the aforementioned first condition, the interleave data $D3_1$, $D3_2$ as codes of FIR type, and uses other interleave data $D3_3$ for the recursivesystematic convolutional operation. The convolutional coder 30' carries out convolutional operation whose code rate is "3/3=1" as coding of inner code, and output coded data D4 to the multi-value modulation mapping circuit 40 in the later stage.

By the provision of the convolutional coder 30' as described above and the multi-value modulation mapping circuit 40 for mapping a signal point as shown in FIG. 30 on the coding apparatus 1, the input distance sum of the minimum Euclidean distance can be set to "10".

Figure 31:
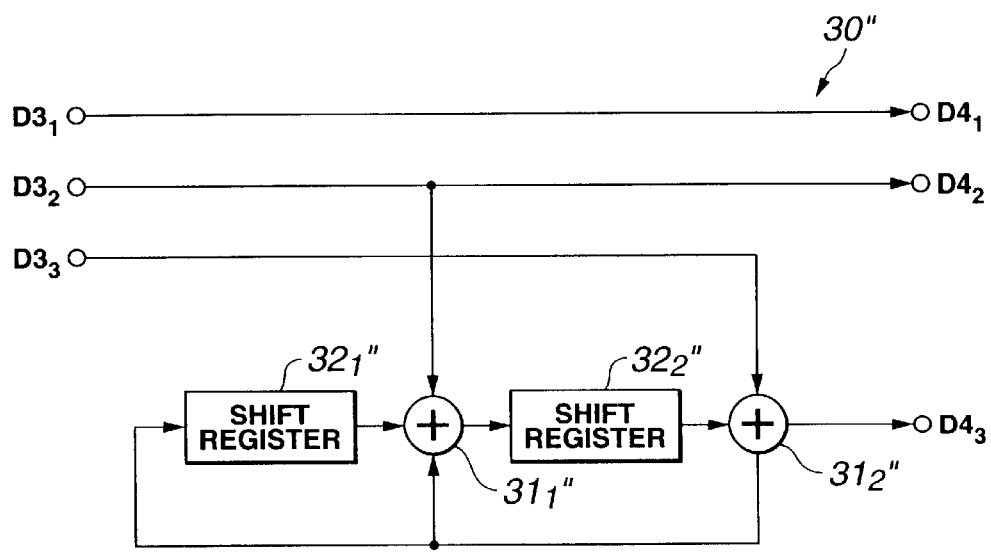
FIG. 31 is a block diagram for explaining still another constitution of a convolutional coder for carrying out coding of inner codes provided on the coding apparatus.
Figure 32:
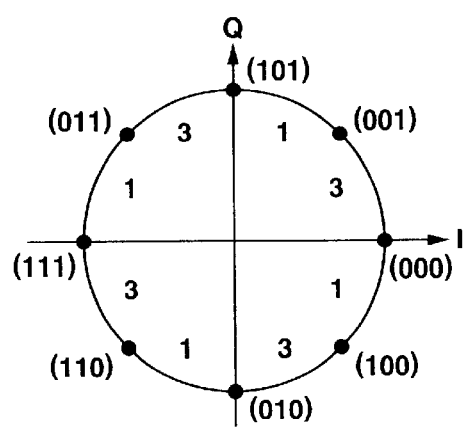
FIG. 32 is a view for explaining the signal point arrangement based on the 8 PSK modulation system, showing the case where the input distance sum of the minimum Euclidean distance is "16".

Further, with respect to the coding of inner code, where coding given by the generator matrix $G_I$ shown in the above formula (14) is carried out, that is, the coding of inner code is carried out by a convolutional coder 30" shown in FIG. 31, and mapping of a signal point can be done as shown in FIG. 32 by the multi-value modulation mapping circuit 40.

That is, the convolutional coder 30" comprises, as shown in FIG. 31, two exclusive OR circuits $31_1"$, $31_2"$, and two shift registers $32_1"$, $32_2"$.

The convolutional coder 30" outputs, when interleave data $D3_1$, $D3_2$, $D3_3$ of 3 bits are input, the interleave data $D3_1$ to the multi-value modulation mapping circuit 40 in the later stag as coded data $D4_1$ as it is without being participated in convolutional operation, and carries out recursivesystematic convolutional operation with respect to the interleave data $D3_2$, $D3_3$ to output the operation result to the multi-value modulation mapping circuit 40 in the later stage. That is, the convolutional coder 30" uses, in order to fulfill the aforementioned first condition, the interleave data $D3_1$ as code of FIR type, and uses other interleave data $D3_2$, $D3_3$ for the recursivesystematic convolutional operation. The convolutional coder 30" carries out convolutional operation whose code rate is "3/3=1" as coding of inner code, and output coded data D4 to the multi-value modulation mapping circuit 40 in the later stage.

With respect to the coding apparatus 1, the convolutional coder 30" as described and the multi-value modulation mapping circuit 40 for mapping a signal point as shown in FIG. 32 are provided to enable the input distance sum of the minimum Euclidean distance making "16".

Furthermore, while in the above-described embodiment, a description has been made of the case where as coding of outer code in the coding apparatus, coding whose code rate is "2/3" is carried out, and as coding of inner code, coding whose code rate is "1" is carried out, it is noted that the present invention is not limited thereto but can be also applied to the case where coding whose code rate is in excess of "1" is carried out as coding of inner code, for example, such that the code rate of outer code is "2/4=1/2", and the code rate of inner code is "4/3", to provide "k/(k+1) (=2/3)" of the code rate as a whole.

Further, while in the above-described embodiment, the 8 PSK modulation system is applied as the multi-value modulation for explanation, the present invention can be also applied to other multi-value modulation systems in which for example, the code rate of outer code in the coding apparatus is "3/4", and the code rate of inner code in the coding apparatus is "1" to provide "3/4" as a whole to thereby apply mapping to a transmission symbol of 16 QAM (16-Quadrature Amplitude Modulation).

Furthermore, while in the above-described embodiment, a description has been made of the case where as the soft-output decoding circuit in the decoding apparatus, MAP decoding based on the BCJR algorithm is carried out, the present invention can be also applied to other soft-output decoding, for example, such that decoding by the so-called SOVA (Soft Output Vitrbi Algorithm) is carried out.

Furthermore, while in the above-described embodiment, a description has been made of the case where the coding apparatus and the decoding apparatus are applied to the transmission apparatus and the receiving apparatus in the data transmit-receive system, the present invention can be applied, for example, to recording and or reproducing apparatus for carrying out recording and or reproducing with respect to recording media such as magnetic, optical or optical-magnetic disk such as a floppy disk, CD-ROM or MO (Magneto Optical). In this case, data recorded by the coding apparatus is recorded in the recording medium equivalent to the memoryless channel and decoded and reproduced by the decoding apparatus.

Figure 33:
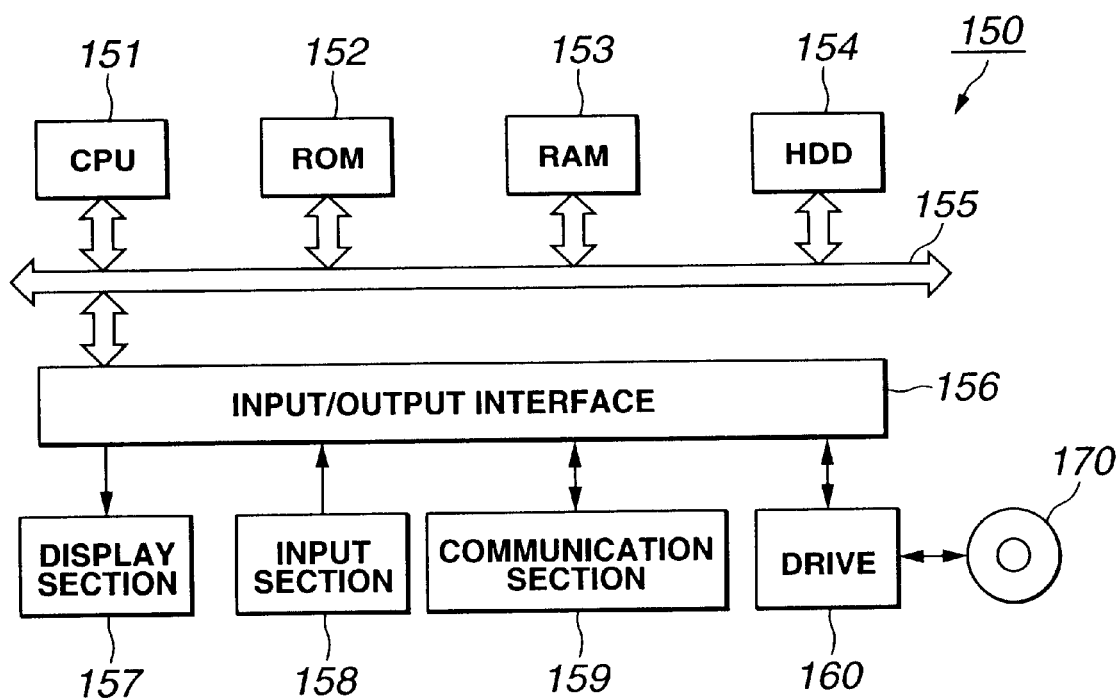
FIG. 33 is a block diagram for explaining the constitution of a computer apparatus.

Furthermore, while in the above-described embodiment, a description has been made of the case where both the coding apparatus and the decoding apparatus are apparatus composed of a hardware, it is noted that these coding apparatus and decoding apparatus can be realized as a software capable of being executed in a computer apparatus, for example, such as a work station and a personal computer. This embodiment will be described hereinafter with reference to FIG. 33.

A computer apparatus 150 comprises, as shown in the figure, a CPU (Central Processing Unit) 151 for collectively controlling various parts, a read only memory 152 for storing information including various programs, a RAM (Random Access Memory) 153 functioning as a work area, a HDD (Hard Disk Drive). 154 for carrying out recording and or reproducing various programs and data, a bus 155 for connecting these CPU 151, ROM 152, RAM 153 and HDD 154, an input/output interface 156 for carrying out inputting/outputting of data between CPU 151, ROM 152, RAM 153 and HDD 154 and a drive 160, a display section 157 for displaying various information, an input section 158 for receipting operation by a user, a communication section 159 for carrying out communication with the outside, and a drive 160 for carrying out recording and or reproducing various information with respect to a detachable recording medium 170.

CPU 151 is connected to ROM 152, RAM 153 and HDD 154 through the bus to control these ROM 152, RAM 153 and HDD 154. CPU 151 is connected to the interface 156 through the bus 155 to control the display section 157, the input section 158, the communication section 159 and the drive 160 connected to the interface 156. Further, CPU 151 executes various programs recorded in ROM 152, RAM 153 and HDD 154 or the recording medium 170 mounted on the drive 160.

ROM 152 stores information including various program. Information stored in ROM 152 are read out under the control of CPU 151.

RAM 153 functions as a work area when CPU 151 executes various programs to temporarily store various programs under the control of CPU 151.

HDD 154 records and or reproduces various programs and data with respect to the hard disk under the control of CPU 151.

The bus 155 transmits various programs read out of ROM 152, RAM 153 and HDD 154 under the control of CPU 151, and transmits various data to be recorded in ROM 152, RAM 153 and HDD 154.

The input/output interface 156 comprises an interface for displaying various information on the display section 157 under the control of CPU 151, an interface for transmitting control signals indicative of contents operated through the input section 158 by a user to CPU, an interface for inputting and outputting data with respect to the outside through the communication section 159 under the control of CPU 151, and an interface for carrying out recording and or reproducing various information with respect to the recording medium 170 mounted on the drive 160, to output data from CPU 151, ROM 152, RAM 153 and HDD 154 to the display section 157, the input section 158, the communication section 159 and the drive 160, and to input data from the display section 157, the input section 158, the communication section 159 and the drive 160 into CPU 151, ROM 152, RAM 153 and HDD 154.

The display section 157 comprises, for example, LCD (Liquid Crystal Display), which displays various information such as data recorded, for example, in HDD 154 under the control of CPU 151.

The input section 158 receives, for example, operation of a keyboard or a mouse by a user to output a control signal indicative of operated contents to CPU 151.

The communication section 159 functions as an interface for carrying out communication with the outside, for example, by a network circuit or a satellite circuit.

The drive 160 mounts or dismounts the recording medium 170 such as a magnetic, optical or optical magnetic disk such as a floppy disk, CD-ROM or MO, and carries out recording and or reproducing various information with respect to the recording median 170 mounted or dismounted under the control of CPU 151.

Such a computer apparatus 150 as described above realizes a coding process in the above-described coding apparatus 1 and or a decoding process in the decoding apparatus 3 by executing programs.

First, the coding process by the computer apparatus 150 will be described. In the computer apparatus 150, when a user carries out fixed operation for executing a coded program, a control signal indicative of operation contents is supplied to CPU 151 by the input section 158. In response thereto, in the computer apparatus 150, CPU 151 loads a coded program onto RAM 153 to execute it, and outputs a coded transmission symbol obtained by coding to the outside through the communication section 159 and to display the processed result or the like on the display section 157 as necessary.

The coded program is provided, for example, by the recording medium 170, and may be read directly from the recording medium 170 under the control of CPU 151 or a program once recorded in the hard disk may be read. Further, the coded program may be stored in advance in ROM 152. Further, data to be recorded is here recorded in the hard disk. This data corresponds to the aforementioned input data D1.

Concretely, when a coded program is executed by CPU 151, the computer apparatus 150 reads the desired data recorded in the hard disk, and carries out convolutional operation whose code rate is "2/3" as coding of outer code with respect to the data to produce coded data corresponding to the aforementioned code data D2.

Continuously, the computer apparatus 150 applies interleave to the coded data produced under the control of CPU 151 to produce interleave data corresponding to the aforementioned interleave data D3. At that time, the computer apparatus 150 applies interleave to the coded data so as to fulfill the aforementioned third condition.

Continuously, the computer apparatus 150 carries out convolutional operation whose code rate is "3/3=1" as coding of inner code with respect to the produced interleave data under the control of CPU 151 to produce the coded data corresponding to the aforementioned coded data D4. At that time, the computer apparatus 150 carries out coding of inner code so as to fulfill the aforementioned first condition.

Then, the computer apparatus 150 applies mapping the produced coded data, for example, to a transmission symbol of the 8 PSK modulation system under the control of CPU 151 to produce a coded transmission symbol corresponding to the aforementioned coded transmission symbol D5. At that time, the computer apparatus 150 carries out mapping the produced coded data so as to fulfill the aforementioned second condition.

The computer apparatus 150 records the produced coded transmission symbol in the hard disk or the like once, after which reads the coded transmission symbol at the desired timing to output it to the outside through the communication section 159, and displays the process result or the like on the display section 157. The produced coded transmission symbol can be also recorded in the recording medium 170 or the like.

As described above, the computer apparatus 150 is able to realize the coding processes in the aforementioned coding apparatus 1 by executing the coded program.

The decoding process in the computer apparatus 150 will be described hereinafter. In the computer apparatus 150, for example, when a user carries out fixed operation for executing a decoded program, a control signal indicative of operation content is supplied to CPU 151 by the input section 158. In response thereto, in the computer apparatus 150, a decoded program on RAM 153 is loaded on RAM 153 by CPU 151 to execute it, which is received from the outside through the communication section 159, and a reception word which corresponds to the aforementioned reception word D6 and is recorded in the hard disk or the like is decoded, and the processed result or the like is displayed on the display section 157 as necessary.

The decoded program is also provided, for example, by the recording medium 170, similarly to the coded program, and may be read directly from the recording medium 170 under the control of CPU 151 or a program once recorded in the hard disk may be read. Further, the decoded program may be stored in advance in ROM 152.

Concretely, when a decoded program is executed by the CPU 151, the computer apparatus 150 carries out MAP decoding, for example, on the basis of BCJR algorithm with respect to a reception word read out of the hard disk, or a reception word received through the communication section 159 whereby soft-output decoding of inner code is carried out to produce extrinsic information corresponding to the aforementioned extrinsic information D8.

Continuously, the computer apparatus 150 applies deinterleave to the produced extrinsic information to produce priori probability information corresponding to the aforementioned priori probability information D9.

Concretely, the computer apparatus 150 carries out MAP decoding, for example, on the basis of BCJR algorithm with respect to the produced priori probability information whereby soft-output decoding of outer code is carried out to produce extrinsic information corresponding to the aforementioned extrinsic information D12, and applies interleave to the extrinsic information to produce priori probability information corresponding to the aforementioned priori probability information D7.

Then, the computer apparatus 151 carries out such decoding operation as described iteratively by the predetermined number of times, for example, several or scores of times under the control of CPU 151 to output decoded data of hard-output on the basis of the extrinsic information of soft-output obtained as a result of the predetermined number of times of decoding operation corresponding to the aforementioned extrinsic information D11.

The computer apparatus 150 records the obtained decoded data in the hard disk or the like under the control of CPU 151, and displays the processed result or the like on the display section 157 as necessary. The obtained data can be also recorded in the recording medium 170 or the like.

As described above, the computer apparatus 150 is able to realize the decoding process in the aforementioned decoding apparatus 3 by executing the decoded program.

Needless to say, the present invention may be changed suitably within the scope not departing from the subject matter thereof.

As described above in detail, in the coding apparatus according to the present invention, the first coding means carries out coding whose code rate is k/(k+1) with respect to data of k-bit input; the (first) interleaving means interleaves order of bits so that at least a part of weights with respect to data comprising a bit series of (k+1) bit supplied from the first coding means are coded by the second coding means; the second coding means carries out coding whose code rate is 1 with respect to data of (k+1) bit input so as to make as small as possible the total value of the hamming distance of input bits between passes to be the minimum Euclidean distance with respect to data of (k+1) bit supplied from the interleaving means; and the mapping means causes the hamming distance of input bits in the second coding means to correspond to a small one as the distance between signal points on the I/Q plane is smaller to apply mapping to data of (k+1) bit supplied from the second coding means to a transmission symbol of a predetermined modulation.

Further, in the coding method or coded program thereof according to the present invention as described, the first coding step carries out coding whose code rate is k/(k+1) with respect to data of k-bit input; the interleaving step interleaves order of bits so that at least a part of weights with respect to data comprising a bit series of (k+1) bit supplied from the first coding step are coded by the second coding step; the second coding step carries out coding whose code rate is 1 with respect to data of (k+1) bit input so as to make as small as possible the total value of the hamming distance of input bits between passes to be the minimum Euclidean distance with respect to data of (k+1) bit supplied from the interleaving step; and the mapping step causes the hamming distance of input bits in the second coding step to correspond to a small one as the distance between signal points on the I/Q plane is smaller to apply mapping to data of (k+1) bit supplied from the second coding step to a transmission symbol of a predetermined modulation system.

Furthermore, in the decoding apparatus for decoding serially concatenated coded modulation signal generated by the above described coding apparatus according to the present invention as described above, the first soft-output decoding means carries out soft-output decoding using a reception word which is a soft-input and priori probability information with respect to the information bit of (k+1) bits which are a soft-input to carry out soft-output decoding; the deinterleaving means rearranges data of (k+1) bits of soft-input; the second soft-output decoding means carries out soft-output decoding using priori probability information with respect to code bits of (k+1) bits which are a soft-input output from the deinterleaving means and priori probability information with respect to information bit of (k+1) bits which are a soft-input; and the second interleaving means interleaves order of bits constituting data comprising a bit series of (k+1) bits output from the second soft-output decoding means on the basis of the same exchange position information as the first interleaving means of the coding apparatus.

Furthermore, in the decoding method for decoding serially concatenated coded modulation signal generated by the above described coding method, or coded program thereof according to the present invention as described above, the first soft-output decoding step carries out soft-output decoding using a reception word which is a soft-input input, and priori probability information with respect to information bits of (k+1) bits which are a soft-input input; the deinterleaving step rearranges data of (k+1) bits of a soft-input input; the second soft-output decoding step carries out soft-output decoding using priori probability information with respect to code bits of (k+1) bits which are a soft-input rearranged by the deinterleaving step, and priori probability information with respect to information bits of (k+1) bits which are a soft-input input; and the second interleaving step interleaves order of bits constituting data comprising a bit series of (k+1) pieces of a soft-input produced by the second soft-output decoding step on the basis of the same exchange position information as that of the first interleaving step of the coding method.

What is claimed is:

1. A coding apparatus for carrying out serially concatenated coded modulation with respect to data input comprising:

a first coding means for carrying out coding whose code rate is k/(k+1) with respect to data of k-bit input;

a interleaving means for interleaving order of bits constituting data comprising a bit series of (k+1) bits coded by said first coding means;

a second coding means serially concatenated with said interleaving means to carry out coding whose code rate is 1 with respect to data of (k+1) bit input; and a mapping means for mapping data of (k+1) bit coded by said second coding means to a transmission symbol of a predetermined modulation, wherein said interleaving means interleaves order of said bits so that at least a part of weights with respect to data comprising a bit series of said (k+1) bit supplied from said first coding means are coded by said second coding means;

said second coding means makes as small as possible the total value of the hamming distance of input bits between passes to be the minimum Euclidean distance with respect to data of (k+1) bit supplied from said interleaving means; and said mapping means causes the hamming distance of input bits in said second coding means to correspond to a small one as the distance between signal points on the I/Q plane is smaller to apply mapping to data of (k+1) bit supplied from said second coding means.

2. The coding apparatus according to claim 1 wherein said first coding means and said second coding means respectively carry out convolutional operation with respect to data input.

3. The coding apparatus according to claim 2 wherein said second coding means outputs at least data of 1 bit out of data of (k+1) bit supplied from said interleaving means as it is without being anticipated in convolutional operation.

4. The coding apparatus according to claim 3 wherein said second coding means outputs uses at least data of 1 bit out of data of (k+1) bit supplied from said interleaving means as a code of a finite impulse response type, and uses data other than said data of 1 bit as a code of an infinite impulse response type for recursive system convolutional operation.

5. The coding apparatus according to claim 1 wherein said interleaving means individually interleaves order of bits constituting said data with respect to data comprising said bit series of (k+1) bit supplied from said first coding means.

6. The coding apparatus according to claim 5 wherein said interleaving means individually interleaves order of bits constituting said data on the basis of exchange position information different from each other with respect to data comprising said bit series of (k+1) bit supplied from said first coding means.

7. The coding apparatus according to claim 1 wherein said interleaving means does not rearrange order of bits constituting at least data comprising a bit series not coded by said second coding means out of said bit series of (k+1) bit supplied from said first coding means.

8. The coding apparatus according to claim 1 wherein said interleaving means individually interleaves order of bits constituting at least data comprising a bit series not coded by said second coding means out of the bit series of (k+1) bit supplied from said first coding means, and order of bits constituting data other than said data on the basis of exchange position information different from each other.

9. The coding apparatus according to claim 1 wherein said interleaving means interleaves order of bits constituting data comprising a bit series of said (k+1) bit supplied from said first coding means so that a remainder obtained by dividing the position number before exchange with k+1 which is the number of data output from said first coding means as a divisor is equal to a remainder obtained by dividing the position number after exchange with k+1 as a divisor.

10. The coding apparatus according to claim 9 wherein said interleaving means reassigns, when a bit of exchange destination is assigned to a arbitrary bit, the bit of exchange destination to said arbitrary bit if the position number of destination of the past predetermined number of bits is present within said predetermined number.

11. The coding apparatus according to claim 1 wherein said interleaving means comprises a random interleaver.

12. The coding apparatus according to claim 1 wherein said mapping means arranges a signal point corresponding to a parallel pass in which the hamming distance of input bits in said second coding means at a position of the minimum Euclidean distance.

13. The coding apparatus according to claim 12 wherein said mapping means applies mapping to data of (k+1) bit supplied from said second coding means so that the input distance sum of the minimum Euclidean distance is 14.

14. The coding apparatus according to claim 12 wherein said mapping means applies mapping to data of (k+1) bit supplied from said second coding means so that the input distance sum of the minimum Euclidean distance is 12.

15. The coding apparatus according to claim 12 wherein said mapping means applies mapping to data of (k+1) bit supplied from said second coding means so that the input distance sum of the minimum Euclidean distance is 10.

16. The coding apparatus according to claim 12 wherein said mapping means applies mapping to data of (k+1) bit supplied from said second coding means so that the input distance sum of the minimum Euclidean distance is 16.

17. The coding apparatus according to claim 1 wherein said mapping means carries out modulation according to a 8 phase shift keying.

18. A coding method for carrying out serially concatenated coded modulation with respect to data input comprising;

first coding whose code rate is k/(k+1) with respect to data of k-bit input;

interleaving order of bits constituting data comprising a bit series of (k+1) bits coded by said first coding step;

second coding whose code rate is 1 with respect to data of (k+1) bit rearranged by said interleaving step; and mapping data of (k+1) bit coded by said second coding step to a transmission symbol of a predetermined modulation; wherein said interleaving step interleaves order of said bits so that at least a part of weights with respect to data comprising a bit series of (k+1) bit coded by said first coding step are coded by said second coding step;

said second coding step makes as small as possible the total value of the hamming distance of input bits between passes to be the minimum Euclidean distance with respect to data of (k+1) bit rearranged by said interleaving step; and said mapping step causes the hamming distance of input bits in said second coding step to correspond to a small one as the distance between signal points on the I/Q plane is smaller to apply mapping to data of (k+1) bit coded by said second coding step.

19. The coding method claim 18 wherein said first coding step and said second coding step respectively carry out convolutional operation with respect to data input.

20. The coding method according to claim 19 wherein said second coding step outputs at least data of 1 bit out of data of (k+1) bit rearranged by said interleaving step as it is without being anticipated in convolutional operation.

21. The coding method according to claim 20 wherein said second coding step uses at least data of 1 bit out of data of (k+1) bit rearranged by said interleaving step as a code of a finite impulse response type, and uses data other than said data of 1 bit as a code of an infinite impulse response type for recursive systematic convolutional operation.

22. The coding method according to claim 18 wherein said interleaving step individually interleaves order of bits constituting said data with respect to data comprising said bit series of (k+1) bit coded by said first coding step.

23. The coding method according to claim 22 wherein said interleaving step individually interleaves order of bits constituting said data on the basis of exchange position information different from each other with respect to data comprising said bit series of (k+1) bit coded by said first coding step.

24. The coding method according to claim 18 wherein said interleaving step does not rearrange order of bits constituting at least data comprising a bit series not coded by said second coding step out of said bit series of (k+1) bit coded by said first coding step.

25. The coding method according to claim 18 wherein said interleaving step individually interleaves order of bits constituting at least data comprising a bit series not coded by said second coding step out of the bit series of (k+1) bit coded by said first coding step, and order of bits constituting data other than said data on the basis of exchange position information different from each other.

26. The coding method according to claim 18 wherein said interleaving step interleaves order of bits constituting data comprising a bit series of said (k+1) bit coded by said first coding step so that a remainder obtained by dividing the position number before exchange with k+1 which is the number of data coded by said first coding step as a divisor is equal to a remainder obtained by dividing the position number after exchange with k+1 as a divisor.

27. The coding method according to claim 26 wherein said interleaving step reassigns, when a bit of exchange destination is assigned to a arbitrary bit, the bit of exchange destination to said arbitrary bit if the position number of destination of the past predetermined number of bits is present within said predetermined number.

28. The coding method according to claim 18 wherein said interleaving step carries out a random interleaver.

29. The coding method according to claim 18 wherein said mapping step arranges a signal point corresponding to a parallel pass in which the hamming distance of input bits in said second coding step at a position of the minimum Euclidean distance.

30. The coding method according to claim 29 wherein said mapping step applies mapping to data of (k+1) bit coded by said second coding step so that the input distance sum of the minimum Euclidean distance is 14.

31. The coding method according to claim 29 wherein said mapping step applies mapping to data of (k+1) bit coded by said second coding step so that the input distance sum of the minimum Euclidean distance is 12.

32. The coding method according to claim 29 wherein said mapping step applies mapping to data of (k+1) bit coded by said second coding step so that the input distance sum of the minimum Euclidean distance is 10.

33. The coding method according to claim 29 wherein said mapping step applies mapping to data of (k+1) bit coded by said second coding step so that the input distance sum of the minimum Euclidean distance is 16.

34. The coding method according to claim 18 wherein said mapping step carries out modulation according to a 8 phase shift keying.

35. A recording medium having recorded a coded program capable of being controlled by a computer for carrying out serially concatenated coded modulation with respect to data input,
said coded program comprising:
first coding whose code rate is k/(k+1) with respect to data of k-bit input;
interleaving order of bits constituting data comprising a bit series of (k+1) bits coded by said first coding step;
second coding whose code rate is 1 with respect to data of (k+1) bit rearranged by the interleaving step; and
mapping data of (k+1) bit coded by said second coding step to a transmission symbol of a predetermined modulation; wherein said interleaving step interleaves order of said bits so that at least a part of weights with respect to data comprising a bit series of (k+1) bit coded by said first coding step are coded by said second coding step;
said second coding step makes as small as possible the total value of the hamming distance of input bits between passes to be the minimum Euclidean distance with respect to data of (k+1) bit rearranged by said interleaving step; and
said mapping step causes the hamming distance of input bits in said second coding step to correspond to a small one as the distance between signal points on the I/Q plane is smaller to apply mapping to data of (k+1) bit coded by said second coding step.

36. A decoding apparatus for carrying out decoding codes subjected to serially concatenated coded modulation by coding equipment comprising:
a first coding means for carrying out coding whose code rate is k/(k+1) with respect to data of k-bit input;
a first interleaving means for interleaving order of bits constituting data comprising a bit series of (k+1) bits coded by said first coding means;
a second coding means serially concatenated with said first interleaving means to carry out coding whose code rate is 1 with respect to data of (k+1) bit input; and
a mapping means for mapping data of (k+1) bit coded by said second coding means to a transmission symbol of a predetermined modulation; wherein said first interleaving means interleaves order of bits so that at least a part of weights with respect to data comprising a bit series of (k+1) bits supplied from the first coding means are coded by said second coding means;
said second coding means makes as small as possible the total value of the hamming distance of input bits between passes to be the minimum Euclidean distance with respect to data of (k+1) bit supplied from said interleaving means; and
said mapping means causes the hamming distance of input bits in said second coding means to correspond to a small one as the distance between signal points on the I/Q plane is smaller to apply mapping to data of (k+1) bit supplied from said second coding means,
said decoding apparatus comprising:
a first soft-output decoding means for carrying out soft-output decoding using a reception word which is a soft-input input and priori probability information with respect to the information bit of (k+1) bits which are a soft-input input to carry out soft-output decoding;

a deinterleaving means serially concatenated with the first soft-output decoding means to rearrange data of (k+1) bits of soft-input input so that a bit array of data of (k+1) bit rearranged by said first interleaving means is returned to a bit array of data of (k+1) bits coded by said first coding means;

a second soft-output decoding means provided corresponding to said first coding means and serially concatenated with said deinterleaving means to carry out soft-output decoding using priori probability information with respect to code bits of (k+1) bits which are a soft-input output from said deinterleaving means and priori probability information with respect to the information bit of (k+1) bits which are a soft-input input; and a second interleaving means for interleaving order of bits constituting data comprising a bit series of (k+1) bits output from said second soft-output decoding means on the basis of the same exchange position information as said first interleaving means, wherein the first soft-output decoding means inputs data of soft-input output from said second interleaving means as priori probability information with respect to information bit.

37. The decoding apparatus according to claim 36 further comprising a binary means for forming extrinsic information of soft-output produced by said second soft-output decoding means into a binary to output it as decoded data of k-bit of hard-output.

38. The decoding apparatus according to claim 36 wherein said first soft-output decoding means and said second soft-output decoding means respectively carry out the maximum posterori probability decoding based on the BCJR algorithm.

39. The decoding apparatus according to claim 36 wherein said first coding means and said second coding means respectively carry out convolutional operation with respect to data input.

40. The decoding apparatus according to claim 39 wherein said second coding means outputs at least data of 1 bit out of data of (k+1) bit supplied from said interleaving means as it is without being anticipated in convolutional operation.

41. The decoding apparatus according to claim 40 wherein said second coding means uses at least data of 1 bit out of data of (k+1) bit supplied from said first interleaving means as a code of a finite impulse response type, and uses data other than said data of 1 bit as a code of an infinite impulse response type for recursive systematic convolutional operation.

42. The decoding apparatus according to claim 36 wherein said first interleaving means individually interleaves order of bits constituting said data with respect to data comprising said bit series of (k+1) bit supplied from said first coding means.

43. The decoding apparatus according to claim 42 wherein said first interleaving means individually interleaves order of bits constituting said data on the basis of exchange position information different from each other with respect to data comprising said bit series of (k+1) bit supplied from said first coding means.

44. The decoding apparatus according to claim 36 wherein said first interleaving means does not rearrange order of bits constituting at least data comprising a bit series not coded by said second coding means out of said bit series of (k+1) bit supplied from said first coding means.

45. The decoding apparatus according to claim 36 wherein said first interleaving means individually interleaves order of bits constituting at least data comprising a bit series not coded by said second coding means out of the bit series of (k+1) bit coded by said first coding means, and order of bits constituting data other than said data on the basis of exchange position information different from each other.

46. The decoding apparatus according to claim 36 wherein said first interleaving means interleaves order of bits constituting data comprising a bit series of said (k+1) bit supplied from said first coding means so that a remainder obtained by dividing the position number before exchange with k+1 which is the number of data output from said first coding means as a divisor is equal to a remainder obtained by dividing the position number after exchange with k+1 as a divisor.

47. The decoding apparatus according to claim 46 wherein said first interleaving means reassigns, when a bit of exchange destination is assigned to a arbitrary bit, the bit of exchange destination to said arbitrary bit if the position number of destination of the past predetermined number of bits is present within said predetermined number.

48. The decoding apparatus according to claim 36 wherein said first interleaving means comprises a random interleaver.

49. The decoding apparatus according to claim 36 wherein said mapping means arranges a signal point corresponding to a parallel pass in which the hamming distance of input bits in said second coding means at a position of the minimum Euclidean distance.

50. The decoding apparatus according to claim 49 wherein said mapping means applies mapping to data of (k+1) bit supplied from said second coding means so that the input distance sum of the minimum Euclidean distance is 14.

51. The decoding apparatus according to claim 49 wherein said mapping means applies mapping to data of (k+1) bit supplied from said second coding means so that the input distance sum of the minimum Euclidean distance is 12.

52. The decoding apparatus according to claim 49 wherein said mapping means applies mapping to data of (k+1) bit supplied from said second coding means so that the input distance sum of the minimum Euclidean distance is 10.

53. The decoding apparatus according to claim 49 wherein said mapping means applies mapping to data of (k+1) bit supplied from said second coding means so that the input distance sum of the minimum Euclidean distance is 10.

54. The decoding apparatus according to claim 36 wherein said mapping means carries out modulation according to a 8 phase shift keying.

55. A decoding method for carrying out serially concatenated coded modulation by a coding method comprising:

a first coding step for carrying out coding whose code rate is k/(k+1) with respect to data of k-bit input;

a first interleaving step for interleaving order of bits constituting data comprising a bit series of (k+1) bits coded by said first coding step;

a second coding step for carrying out coding whose code rate is 1 with respect to data of (k+1) bit rearranged by said first interleaving step; and a mapping step for mapping data of (k+1) bit coded by said second coding step to a transmission symbol of a predetermined modulation, wherein said first interleaving step interleaves order of bits so that at least a part of weights with respect to data comprising a bit series of (k+1) bit coded by said first coding step are coded by said second coding step; said second coding step makes as small as possible the total value of the hamming distance of input bits between passes to be the minimum Euclidean distance with respect to data of (k+1) bit rearranged by said first interleaving step; and said mapping step causes the hamming distance of input bits in said second coding step to correspond to a small one as the distance between signal points on the I/Q plane is smaller to apply mapping to data of (k+1) bit coded by said second coding step, said decoding method comprising;

first soft-output decoding, corresponding to said second coding step, using a reception word which is a soft-input input, and priori probability information with respect to information bits of (k+1) bits which are a soft-input input;

deinterleaving data of (k+1) bits of a soft-input input so that a bit array of data of (k+1) bits rearranged by said first interleaving step is returned to a bit array of data of (k+1) bits coded by said first coding step;

second soft-output decoding, corresponding to said coding step, using priori probability information with respect to code bits of (k+1) bits which are a soft-input rearranged by said deinterleaving step, and priori probability information with respect to information bits of (k+1) bits which are a soft-input input; and second interleaving order of bits constituting data comprising a bit series of (k+1) pieces of a soft-input produced by said second soft-output decoding step on the basis of the same exchange position information as that of said first interleaving step, wherein said first soft-output decoding step inputs data of soft-input rearranged by said second interleaving step as priori probability information with respect to information bit.

56. The decoding method according to claim 55 further comprising forming extrinsic information of soft-output produced by said second soft-output decoding step into a binary to output it as decoded data of k-bit of hard-output.

57. The decoding method according to claim 55 wherein said first soft-output decoding step and said second soft-output decoding step respectively carry out the maximum posterori probability decoding based on the BCJR algorithm.

58. The decoding method according to claim 55 wherein said first coding step and said second coding step respectively carry out convolutional operation with respect to data input.

59. The decoding method according to claim 58 wherein said second coding step outputs at least data of 1 bit out of data of (k+1) bit rearranged by said first interleaving step as it is without being anticipated in convolutional operation.

60. The decoding method according to claim 59 wherein said second coding step uses at least data of 1 bit out of data of (k+1) bit rearranged by said first interleaving step as a code of a finite impulse response type, and uses data other than said data of 1 bit as a code of an infinite impulse response type for recursive systematic convolutional operation.

61. The decoding method according to claim 55 wherein said first interleaving step individually interleaves order of bits constituting said data with respect to data comprising said bit series of (k+1) bit coded by said first coding step.

62. The decoding method according to claim 61 wherein said first interleaving step individually interleaves order of bits constituting said data on the basis of exchange position information different from each other with respect to data comprising said bit series of (k+1) bit coded by said first coding step.

63. The decoding method according to claim 55 wherein said first interleaving step does not rearrange order of bits constituting at least data comprising a bit series not coded by said second coding step out of said bit series of (k+1) bit coded by said first coding step.

64. The decoding method according to claim 55 wherein said first interleaving step individually interleaves order of bits constituting at least data comprising a bit series not coded by said second coding step out of the bit series of (k+1) bit coded by said first coding step, and order of bits constituting data other than said data on the basis of exchange position information different from each other.

65. The decoding method according to claim 55 wherein said first interleaving step interleaves order of bits constituting data comprising a bit series of said (k+1) bit coded by said first coding step so that a remainder obtained by dividing the position number before exchange with k+1 which is the number of data coded by said first coding step as a divisor is equal to a remainder obtained by dividing the position number after exchange with k+1 as a divisor.

66. The decoding method according to claim 65 wherein said first interleaving step reassigns, when a bit of exchange destination is assigned to a arbitrary bit, the bit of exchange destination to said arbitrary bit if the position number of destination of the past predetermined number of bits is present within said predetermined number.

67. The decoding method according to claim 55 wherein said first interleaving step and said second interleaving step respectively carry out random.

68. The decoding method according to claim 55 wherein said mapping step arranges a signal point corresponding to a parallel pass in which the hamming distance of input bits in said second coding step at a position of the minimum Euclidean distance.

69. The decoding method according to claim 68 wherein said mapping step applies mapping to data of (k+1) bit coded by said second coding step so that the input distance sum of the minimum Euclidean distance is 14.

70. The decoding method according to claim 68 wherein said mapping step applies mapping to data of (k+1) bit coded by said second coding step so that the input distance sum of the minimum Euclidean distance is 12.

71. The decoding method according to claim 68 wherein said mapping step applies mapping to data of (k+1) bit coded by said second coding step so that the input distance sum of the minimum Euclidean distance is 10.

72. The decoding method according to claim 68 wherein said mapping step applies mapping to data of (k+1) bit coded by said second coding step so that the input distance sum of the minimum Euclidean distance is 16.

73. The decoding method according to claim 55 wherein said mapping step carries out modulation according to a 8 phase shift keying.

74. A recording medium having recorded a decoded program capable of being controlled by a computer for carrying out decoding of codes subjected to serially concatenated coded modulation by a coding method comprising:

a first coding step for carrying out coding whose code rate is k/(k+1) with respect to data of k-bit input;

a first interleaving step for interleaving order of bits constituting data comprising a bit series of (k+1) pieces coded by said first coding step;

a second coding step for carrying out coding whose code rate is 1 with respect to data of (k+1) bit rearranged by said first interleaving step; and a mapping step for mapping data of (k+1) bits coded by said second coding step to a transmission symbol of a predetermined modulation, wherein said first interleaving step interleaves order of bits so that at least a part of weights with respect to data comprising a bit series of (k+1) pieces coded by said first coding step are coded by said second coding step; said second coding step makes as small as possible the total value of the hamming distance of input bit between passes to be the minimum Euclidean distance with respect to data of (k+1) bits rearranged by said interleaving step; said mapping step causes the hamming distance of input bits in said second coding step as the distance between signal points on the I/Q plane is smaller to apply mapping to data of (k+1) bits coded by the second coding step, said decoding program comprising:

first soft-output decoding, corresponding to said second coding step, using a reception word which is a soft-input input, and priori probability information with respect to information bits of (k+1) bits which are a soft-input input;

deinterleaving data of (k+1) bits of a soft-input input so that a bit array of data of (k+1) bits rearranged by said first interleaving step is returned to a bit array of data of (k+1) bits coded by said first coding step;

second soft-output decoding step, corresponding to said first coding step, using priori probability information with respect to code bits of (k+1) bits which are a soft-input rearranged by said deinterleaving step, and priori probability information with respect to information bits of (k+1) bits which are a soft-input input; and second interleaving order of bits constituting data comprising a bit series of (k+1) pieces of a soft-input produced by said second soft-output decoding step on the basis of the same exchange position information as that of said first interleaving step, wherein said first soft-output decoding step inputs data of soft-input rearranged by said second interleaving step as priori probability information with respect to the information bits.

75. The recording medium according to claim 74 wherein said decoding program comprises a binary step for forming extrinsic information of soft-output produced by said second soft-output decoding step into a binary to output it as decoded data of k-bit of hard-output.

* * * * *